(12) United States Patent
Brauer

(10) Patent No.: US 11,328,410 B2
(45) Date of Patent: May 10, 2022

(54) DEEP GENERATIVE MODELS FOR OPTICAL OR OTHER MODE SELECTION

(71) Applicant: KLA Corporation, Milpitas, CA (US)

(72) Inventor: Bjorn Brauer, Beaverton, OR (US)

(73) Assignee: KLA Corp., Milpitas, CA (US)

(*) Notice: Subject to any disclaimer, the term of this patent is extended or adjusted under 35 U.S.C. 154(b) by 0 days.

(21) Appl. No.: 17/375,951

(22) Filed: Jul. 14, 2021

(65) Prior Publication Data

US 2022/0036539 A1 Feb. 3, 2022

Related U.S. Application Data

(60) Provisional application No. 63/060,131, filed on Aug. 3, 2020.

(51) Int. Cl.
| | | |
|---|---|---|
| *G06T 7/00* | (2017.01) | |
| *G06N 3/04* | (2006.01) | |
| *G06F 30/20* | (2020.01) | |

(52) U.S. Cl.
CPC ............ *G06T 7/0004* (2013.01); *G06F 30/20* (2020.01); *G06N 3/0454* (2013.01); *G06T 2207/20081* (2013.01); *G06T 2207/20084* (2013.01)

(58) Field of Classification Search
CPC ......... G06T 7/0004; G06T 2207/20081; G06T 2207/20084; G06F 30/20; G06N 3/0454
See application file for complete search history.

(56) References Cited

U.S. PATENT DOCUMENTS

| | | |
|---|---|---|
| 7,570,796 B2 | 8/2009 | Zafar et al. |
| 7,676,077 B2 | 3/2010 | Kulkarni et al. |
| 8,126,255 B2 | 2/2012 | Bhaskar et al. |
| 8,664,594 B1 | 4/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |
| 9,222,895 B2 | 12/2015 | Duffy et al. |
| 9,702,827 B1 | 7/2017 | Brauer et al. |
| 10,115,040 B2 | 10/2018 | Brauer |

(Continued)

OTHER PUBLICATIONS

International Search Report and Written Opinion for PCT/US2021/043587 dated Nov. 8, 2021.
Goodfellow et al., "Generative Adversarial Nets," arXiv:1406.2661, Jun. 10, 2014, 9 pages.
Isola et al., "Image-to-Image Translation with Conditional Adversarial Networks," arXiv:1611.07004v2, Nov. 22, 2017, 17 pages.

(Continued)

*Primary Examiner* — Ping Y Hsieh
(74) *Attorney, Agent, or Firm* — Ann Marie Mewherter

(57) ABSTRACT

Methods and systems for selecting a mode of a tool used for a process performed on a specimen are provided. One system includes one or more computer subsystems and one or more components executed by the one or more computer subsystems. The one or more components include a generative adversarial network (GAN), e.g., a conditional GAN (cGAN). The computer subsystem(s) are configured for modifying a portion of design data for a specimen to generate an artificially defective portion of the design data and generating simulated images for the specimen by inputting the portion of the design data and the artificially defective portion of the design data into the GAN. The computer subsystem(s) are also configured for determining one or more characteristics of the simulated images and selecting a mode of a tool used for a process performed on the specimen based on the determined one or more characteristics.

23 Claims, 6 Drawing Sheets

(56) References Cited

U.S. PATENT DOCUMENTS

| | | | |
|---|---|---|---|
| 10,964,016 B2 | 3/2021 | Brauer | |
| 11,010,885 B2 | 5/2021 | Brauer et al. | |
| 2012/0078591 A1 | 3/2012 | Sims, Jr. | |
| 2017/0191948 A1 | 7/2017 | Gao et al. | |
| 2019/0303717 A1 | 10/2019 | Bhaskar et al. | |
| 2020/0098101 A1 | 3/2020 | Pandey et al. | |
| 2020/0143528 A1 | 5/2020 | Kulkarni et al. | |
| 2021/0097704 A1 | 4/2021 | Brauer et al. | |
| 2021/0142467 A1* | 5/2021 | Burkhardt | B23K 31/02 |
| 2021/0158503 A1* | 5/2021 | Li | G06K 9/6256 |
| 2021/0272273 A1 | 9/2021 | Brauer | |
| 2021/0287352 A1* | 9/2021 | Calderon | G06V 10/772 |
| 2021/0334946 A1* | 10/2021 | Buzaglo | G06T 7/001 |

OTHER PUBLICATIONS

Kingma et al., "Semi-supervised Learning with Deep Generative Models," NIPS 2014, arXiv:1406.5298v2, Oct. 31, 2014, 9 pages.

Makhzani et al., "Adversarial Autoencoders," arXiv:1511.05644v2, May 25, 2016, 16 pages.

Mirza et al., "Conditional Generative Adversarial Nets," arXiv:1411.1784, Nov. 6, 2014, 7 pages.

Szegedy et al., "Going Deeper with Convolutions," 2015 IEEE Conference on Computer Vision and Pattern Recognition (CVPR), Jun. 2015, 9 pages.

U.S. Appl. No. 17/170,688 by Brauer filed Jan. 8, 2021 (submitted as U.S. Patent Application Publication No. 2021/0272273 on Sep. 2, 2021).

U.S. Appl. No. 17/308,878 by Brauer et al. filed May 5, 2021.

* cited by examiner

DEEP GENERATIVE MODELS FOR OPTICAL OR OTHER MODE SELECTION

BACKGROUND OF THE INVENTION

1. Field of the Invention

The present invention generally relates to methods and systems for selecting a mode of a tool used for a process performed on a specimen.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to drive higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

One significant hurdle in setting up most inspection processes is identifying a sufficient number of defects of interest (DOIs) that can then be used to set various parameters of the inspection processes. For example, old methods rely on the availability of DOI; however, in many cases, the number of DOI examples is substantially restricted and they can be easily destroyed through the process of data collection, e.g., in the case of print check-based defect applications. Such DOIs are typically required for setting both hardware parameters such as optical or other imaging parameters and software type parameters such as defect classification settings, nuisance filter parameters, and the like. Proper optical mode selection is not possible when defects and/or wafers get altered by the optical or other inspection tool or when no defects are available. In this manner, if not enough DOI examples can be found on the setup specimen or specimens, the resulting inspection recipe may be sub-optimal for detecting and identifying those DOIs on other specimens.

While nuisance examples may also be useful for setting up such hardware and software parameters, nuisance examples tend to be readily and overwhelmingly available. For example, when setting up a new inspection process, a hot scan may be performed on a setup specimen in which the threshold for defect detection is set at, near, or even in the noise floor of the inspection system output. Therefore, such a scan may produce many more nuisance examples than needed, and those nuisances can make identifying DOI examples particularly difficult because they need to be separated from all of the detected events, most of which are nuisances.

Accordingly, it would be advantageous to develop systems and methods for selecting a mode of a tool used for a process performed on a specimen that do not have one or more of the disadvantages described above.

SUMMARY OF THE INVENTION

The following description of various embodiments is not to be construed in any way as limiting the subject matter of the appended claims.

One embodiment relates to a system configured to select a mode of a tool used for a process performed on a specimen. The system includes one or more computer subsystems and one or more components executed by the one or more computer subsystems. The one or more components include a generative adversarial network (GAN). The one or more computer subsystems are configured for modifying a portion of design data for a specimen to generate an artificially defective portion of the design data. The one or more computer subsystems are also configured for generating simulated images for the specimen by inputting the portion of the design data and the artificially defective portion of the design data into the GAN. In addition, the one or more computer subsystems are configured for determining one or more characteristics of the simulated images and selecting a mode of a tool used for a process performed on the specimen based on the determined one or more characteristics. The system may be further configured as described herein.

Another embodiment relates to a computer-implemented method for selecting a mode of a tool used for a process performed on a specimen. The method includes the modifying, generating, determining, and selecting steps described above, which are performed by one or more computer systems. Each of the steps of the method may be further performed as described further herein. The method may include any other step(s) of any other method(s) described herein. The method may be performed by any of the systems described herein.

Another embodiment relates to a non-transitory computer-readable medium storing program instructions executable on one or more computer systems for performing a computer-implemented method for selecting a mode of a tool used for a process performed on a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
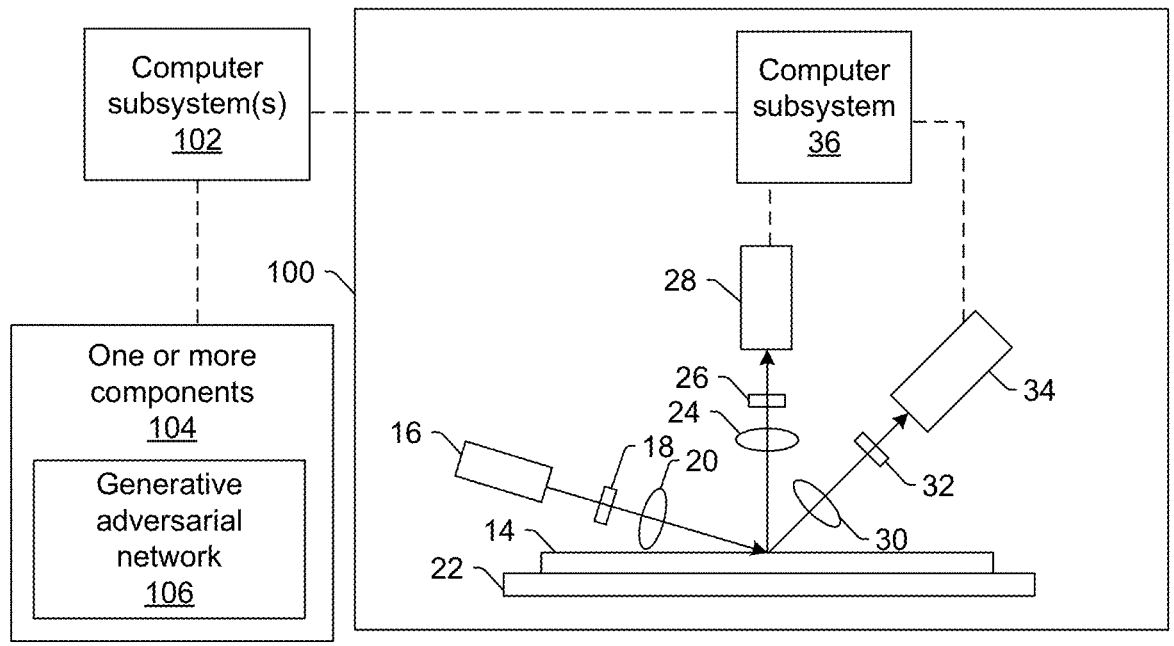
FIGS. 1 and 1a are schematic diagrams illustrating side views of embodiments of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design," "design data," and "design information" as used interchangeably herein generally refer to the physical design (layout) of an IC or other semiconductor device and data derived from the physical design through complex simulation or simple geometric and Boolean operations. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data. Furthermore, the "design," "design data," and "design information" described herein refers to information and data that is generated by semiconductor device designers in a design process and is therefore available for use in the embodiments described herein well in advance of printing of the design on any physical specimens such as reticles and wafers.

"Nuisances" (which is sometimes used interchangeably with "nuisance defects" or "nuisance events") as that term is used herein is generally defined as defects that a user does not care about and/or events that are detected on a specimen but are not really actual defects on the specimen. Nuisances that are not actually defects may be detected as events due to non-defect noise sources on a specimen (e.g., grain in metal lines on the specimen, signals from underlaying layers or materials on the specimen, line edge roughness (LER), relatively small critical dimension (CD) variation in patterned features, thickness variations, etc.) and/or due to marginalities in the inspection system itself or its configuration used for inspection.

The term "defects of interest (DOIs)" as used herein is defined as defects that are detected on a specimen and are actual defects on the specimen. Therefore, the DOIs are of interest to a user because users generally care about how many and what kind of actual defects are on specimens being inspected. In some contexts, the term "DOI" is used to refer to a subset of all of the actual defects on the specimen, which includes only the actual defects that a user cares about. For example, there may be multiple types of DOIs on any given specimen, and one or more of them may be of greater interest to a user than one or more other types. In the context of the embodiments described herein, however, the term "DOIs" is used to refer to any and all real defects on a specimen.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

In general, the embodiments described herein include a deep generative model such as a generative adversarial network (GAN) or a type of GAN such as a conditional GAN (cGAN) for improved optical or other mode selection. As described further herein, some embodiments create a new way to perform defect augmentation using a GAN or cGAN for mode selection purposes. The embodiments create new ways to perform optical and other mode selection for tools such as bright field inspection tools by making use of a GAN network structure.

In some embodiments, the specimen is a wafer. The wafer may include any wafer known in the semiconductor arts. Although some embodiments may be described herein with respect to a wafer or wafers, the embodiments are not limited in the specimens for which they can be used. For example, the embodiments described herein may be used for specimens such as reticles, flat panels, personal computer (PC) boards, and other semiconductor specimens.

One embodiment relates to a system configured to select a mode of a tool used for a process performed on a specimen. One embodiment of such a system is shown in FIG. 1. The system includes one or more computer subsystems 102 and one or more components 104 executed by the one or more computer subsystems. In some embodiments, the system includes a tool such as an inspection tool coupled to the one or more computer subsystems. For example, in FIG. 1, the system includes inspection tool 100 coupled to computer subsystems(s) 102. In the embodiments shown in FIG. 1, the tool is configured as a light based inspection tool. However, in other embodiments described herein, the tool is configured as an electron beam or charged particle beam inspection tool.

In general, the inspection tools described herein include at least an energy source, a detector, and a scanning subsystem. The energy source is configured to generate energy that is directed to a specimen by the inspection tool. The detector is configured to detect energy from the specimen and to generate output responsive to the detected energy. The scanning subsystem is configured to change a position on the specimen to which the energy is directed and from which the energy is detected.

In a light-based inspection tool, the energy directed to the specimen includes light, and the energy detected from the specimen includes light. In the embodiment of the system shown in FIG. 1, the inspection tool includes an illumination subsystem configured to direct light to specimen 14. The illumination subsystem includes at least one light source, e.g., as shown in FIG. 1, light source 16. The illumination subsystem may be configured to direct the light to the specimen at one or more angles of incidence, which may include one or more oblique angles and/or one or more normal angles. For example, as shown in FIG. 1, light from light source 16 is directed through optical element 18 and then lens 20 to specimen 14 at an oblique angle of incidence. The oblique angle of incidence may include any suitable oblique angle of incidence, which may vary depending on, for instance, characteristics of the specimen and the defects to be detected on the specimen.

The illumination subsystem may be configured to direct the light to the specimen at different angles of incidence at different times. For example, the inspection tool may be configured to alter one or more characteristics of one or more elements of the illumination subsystem such that the light can be directed to the specimen at an angle of incidence that is different than that shown in FIG. 1. In one such example, the inspection tool may be configured to move light source 16, optical element 18, and lens 20 such that the light is directed to the specimen at a different oblique angle of incidence or a normal (or near normal) angle of incidence.

In some instances, the inspection tool may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example in some instances, optical element 18 may be configured as a spectral filter and the properties of the spectral filter can be changed in a variety of different ways (e.g., by swapping out one spectral filter with another) such that different wavelengths of light can be directed to the specimen at different times. The illumination subsystem may have any other suitable configuration known in the art for directing the light having different or the same characteristics to the specimen at different or the same angles of incidence sequentially or simultaneously.

Light source 16 may include a broadband plasma (BBP) light source. In this manner, the light generated by the light source and directed to the specimen may include broadband light. However, the light source may include any other suitable light source such as a laser. The laser may include any suitable laser known in the art and may be configured to generate light at any suitable wavelength(s) known in the art. The laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused onto specimen 14 by lens 20. Although lens 20 is shown in FIG. 1 as a single refractive optical element, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for the process.

The inspection tool also includes a scanning subsystem configured to change the position on the specimen to which the light is directed and from which the light is detected and possibly to cause the light to be scanned over the specimen. For example, the inspection tool may include stage 22 on which specimen 14 is disposed during inspection. The scanning subsystem may include any suitable mechanical and/or robotic assembly (that includes stage 22) that can be configured to move the specimen such that the light can be directed to and detected from different positions on the specimen. In addition, or alternatively, the inspection tool may be configured such that one or more optical elements of the inspection tool perform some scanning of the light over the specimen such that the light can be directed to and detected from different positions on the specimen. In instances in which the light is scanned over the specimen, the light may be scanned over the specimen in any suitable fashion such as in a serpentine-like path or in a spiral path.

The inspection tool further includes one or more detection channels. At least one of the detection channel(s) includes a detector configured to detect light from the specimen due to illumination of the specimen by the tool and to generate output responsive to the detected light. For example, the inspection tool shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, both detection channels are configured to detect scattered light, and the detection channels are configured to detect light that is scattered at different angles from the specimen. However, one or more of the detection channels may be configured to detect another type of light from the specimen (e.g., reflected light).

As further shown in FIG. 1, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 30, element 32, and detector 34 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 1 shows an embodiment of the inspection tool that includes two detection channels, the inspection tool may include a different number of detection channels (e.g., only one detection channel or two or more detection channels). In one such instance, the detection channel formed by collector 30, element 32, and detector 34 may form one side channel as described above, and the inspection tool may include an additional detection channel (not shown) formed as another side channel that is positioned on the opposite side of the plane of incidence. Therefore, the inspection tool may include the detection channel that includes collector 24, element 26, and detector 28 and that is centered in the plane of incidence and configured to collect and detect light at scattering angle(s) that are at or close to normal to the specimen surface. This detection channel may therefore be commonly referred to as a "top" channel, and the inspection tool may also include two or more side channels configured as described above. As such, the inspection tool may include at least three channels (i.e., one top channel and two side channels), and each of the at least three channels has its own collector, each of which is configured to collect light at different scattering angles than each of the other collectors.

As described further above, each of the detection channels included in the inspection tool may be configured to detect scattered light. Therefore, the inspection tool shown in FIG. 1 may be configured for dark field (DF) inspection of specimens. However, the inspection tool may also or alternatively include detection channel(s) that are configured for bright field (BF) inspection of specimens. In other words, the inspection tool may include at least one detection channel that is configured to detect light specularly reflected from the specimen. Therefore, the inspection tools described herein may be configured for only DF, only BF, or both DF and BF inspection. Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art such as photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the light such as intensity but may not be configured to detect such characteristics as a function of position within the imaging plane. As such, the output that is generated by each of the detectors included in each of the detection channels may be signals or data, but not image signals or image data. In such instances, a computer subsystem such as computer subsystem 36 of the inspection tool may be configured to generate images of the specimen from the non-imaging output of the detectors. However, in other instances, the detectors may be configured as imaging detectors that are configured to generate imaging signals or image data. Therefore, the inspection tool may be configured to generate images in a number of ways.

It is noted that FIG. 1 is provided herein to generally illustrate a configuration of an inspection tool that may be included in the system embodiments described herein. Obviously, the inspection tool configuration described herein may be altered to optimize the performance of the inspection tool as is normally performed when designing a commercial inspection tool. In addition, the systems described herein may be implemented using an existing inspection tool (e.g., by adding functionality described herein to an existing inspection tool) such as the 29xx/39xx series of tools that are commercially available from KLA Corp., Milpitas, Calif. For some such systems, the methods described herein may be provided as optional functionality of the inspection tool (e.g., in addition to other functionality of the inspection tool). Alternatively, the inspection tool described herein may be designed "from scratch" to provide a completely new inspection tool.

Computer subsystem 36 may be coupled to the detectors of the inspection tool in any suitable manner (e.g., via one or more transmission media, which may include "wired" and/or "wireless" transmission media) such that the computer subsystem can receive the output generated by the detectors. Computer subsystem 36 may be configured to perform a number of functions using the output of the detectors. For instance, the computer subsystem may be configured to detect events on the specimen to using the output of the detectors. Detecting the events on the specimen may be performed by applying some defect detection algorithm and/or method to the output generated by the detectors, which may include any suitable algorithm and/or method known in the art. For example, the computer subsystem may compare the output of the detectors to a threshold. Any output having values above the threshold may be identified as an event (e.g., a potential defect) while any output having values below the threshold may not be identified as an event.

The computer subsystem of the inspection tool may be further configured as described herein. For example, computer subsystem 36 may be part of the one or more computer subsystems described herein or may be configured as the one or more computer subsystems described herein. In particular, computer subsystem 36 may be configured to perform the steps described herein. As such, the steps described herein may be performed "on-tool," by a computer system or subsystem that is part of an inspection tool.

The computer subsystem of the inspection tool (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems. For example, computer subsystem 36 may be coupled to computer subsystems(s) 102 as shown by the dashed line in FIG. 1 by any suitable transmission media, which may include any suitable wired and/or wireless transmission media known in the art. Two or more of such computer subsystems may also be effectively coupled by a shared computer-readable storage medium (not shown).

Although the inspection tool is described above as being an optical or light-based inspection tool, in another embodiment, the tool is configured as an electron beam inspection tool. In an electron beam inspection tool, the energy directed to the specimen includes electrons, and the energy detected from the specimen includes electrons. In one such embodiment shown in FIG. 1a, the inspection tool includes electron column 122, and the system includes computer subsystem 124 coupled to the inspection tool. Computer subsystem 124 may be configured as described above. In addition, such an inspection tool may be coupled to another one or more computer subsystems in the same manner described above and shown in FIG. 1.

Figure 1A:
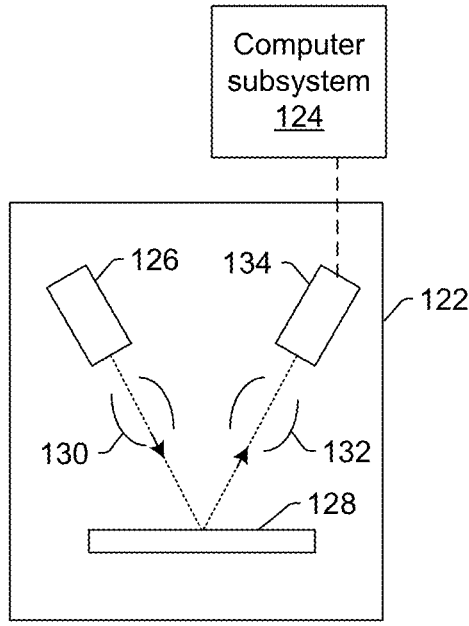

As also shown in FIG. 1a, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1a as being configured such that the electrons are directed to the specimen at an oblique angle of incidence and are scattered from the specimen at another oblique angle, the electron beam may be directed to and scattered from the specimen at any suitable angles. In addition, the electron beam inspection tool may be configured to use multiple modes to generate output for the specimen as described further herein (e.g., with different illumination angles, collection angles, etc.). The multiple modes of the electron beam inspection tool may be different in any output generation parameters of the inspection tool.

Computer subsystem 124 may be coupled to detector 134 as described above. The detector may detect electrons returned from the surface of the specimen thereby forming electron beam images of (or other output for) the specimen. The electron beam images may include any suitable electron beam images. Computer subsystem 124 may be configured to detect events on the specimen using output generated by detector 134, which may be performed as described above or in any other suitable manner. Computer subsystem 124 may be configured to perform any additional step(s) described herein. A system that includes the inspection tool shown in FIG. 1a may be further configured as described herein.

It is noted that FIG. 1a is provided herein to generally illustrate a configuration of an electron beam inspection tool that may be included in the embodiments described herein. As with the optical inspection tool described above, the electron beam inspection tool configuration described herein may be altered to optimize the performance of the inspection tool as is normally performed when designing a commercial inspection tool. In addition, the systems described herein may be implemented using an existing inspection tool (e.g., by adding functionality described herein to an existing inspection tool) such as the tools that are commercially available from KLA. For some such systems, the methods described herein may be provided as optional functionality of the system (e.g., in addition to other functionality of the system). Alternatively, the system described herein may be designed "from scratch" to provide a completely new system.

Although the inspection tool is described above as being a light or electron beam inspection tool, the tool may be an ion beam inspection tool. Such an inspection tool may be configured as shown in FIG. 1a except that the electron beam source may be replaced with any suitable ion beam source known in the art. In addition, the inspection tool may include any other suitable ion beam imaging tool such as those included in commercially available focused ion beam (FIB) systems, helium ion microscopy (HIM) systems, and secondary ion mass spectroscopy (SIMS) systems.

As further noted above, the tool may be configured to have multiple modes. In general, a "mode" is defined by the values of parameters of the tool used to generate output for the specimen. Therefore, modes that are different may be different in the values for at least one of the optical or electron beam parameters of the tool (other than position on the specimen at which the output is generated). For example, for a light-based inspection tool, different modes may use different wavelengths of light. The modes may be different in the wavelengths of light directed to the specimen as described further herein (e.g., by using different light sources, different spectral filters, etc.) for different modes. In another embodiment, different modes may use different illumination channels. For example, as noted above, the inspection tool may include more than one illumination channel. As such, different illumination channels may be used for different modes.

The multiple modes may also be different in illumination and/or collection/detection. For example, as described further above, the tool may include multiple detectors. One of the detectors may be used for one mode, and another of the detectors may be used for another mode. Furthermore, the modes may be different from each other in more than one way described herein (e.g., different modes may have one or more different illumination parameters and one or more different detection parameters). The tool may be configured to scan the specimen with the different modes in the same scan or different scans, e.g., depending on the capability of using multiple modes to scan the specimen at the same time.

The tools described herein may be configured as another type of semiconductor-related process/quality control type tool such as a defect review tool and a metrology tool. For example, the embodiments of the tools described herein and shown in FIGS. 1 and 1a may be modified in one or more parameters to provide different imaging capability depending on the application for which they will be used. In one embodiment, the electron beam inspection tool configuration described herein may be modified to be configured as an electron beam defect review tool. For example, the tool shown in FIG. 1a may be configured to have a higher resolution if it is to be used for defect review or metrology rather than for inspection. In other words, the embodiments of the tool shown in FIGS. 1 and 1a describe some general and various configurations for a tool that can be tailored in a number of manners that will be obvious to one skilled in the art to produce tools having different imaging capabilities that are more or less suitable for different applications.

As noted above, the tools may be configured for directing energy (e.g., light, electrons) to and/or scanning energy over a physical version of the specimen thereby generating actual images for the physical version of the specimen. In this manner, the tools may be configured as "actual" imaging tools, rather than "virtual" tools. A storage medium (not shown) and computer subsystem(s) 102 shown in FIG. 1 may be configured as a "virtual" tool. Systems and methods configured as "virtual" inspection tools are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents.

The one or more components executed by the one or more computer subsystems include generative adversarial network (GAN) 106 shown in FIG. 1. In one embodiment, the GAN is trained with images of the specimen or another specimen of the same type as the specimen generated by the tool and the design data for the specimen or the other specimen. The GAN may or may not be trained by the one or more computer subsystems and/or one of the component(s) executed by the computer subsystem(s). For example, another method or system may train the GAN, which then may be stored for use as the component(s) executed by the computer subsystem(s).

Figure 2:
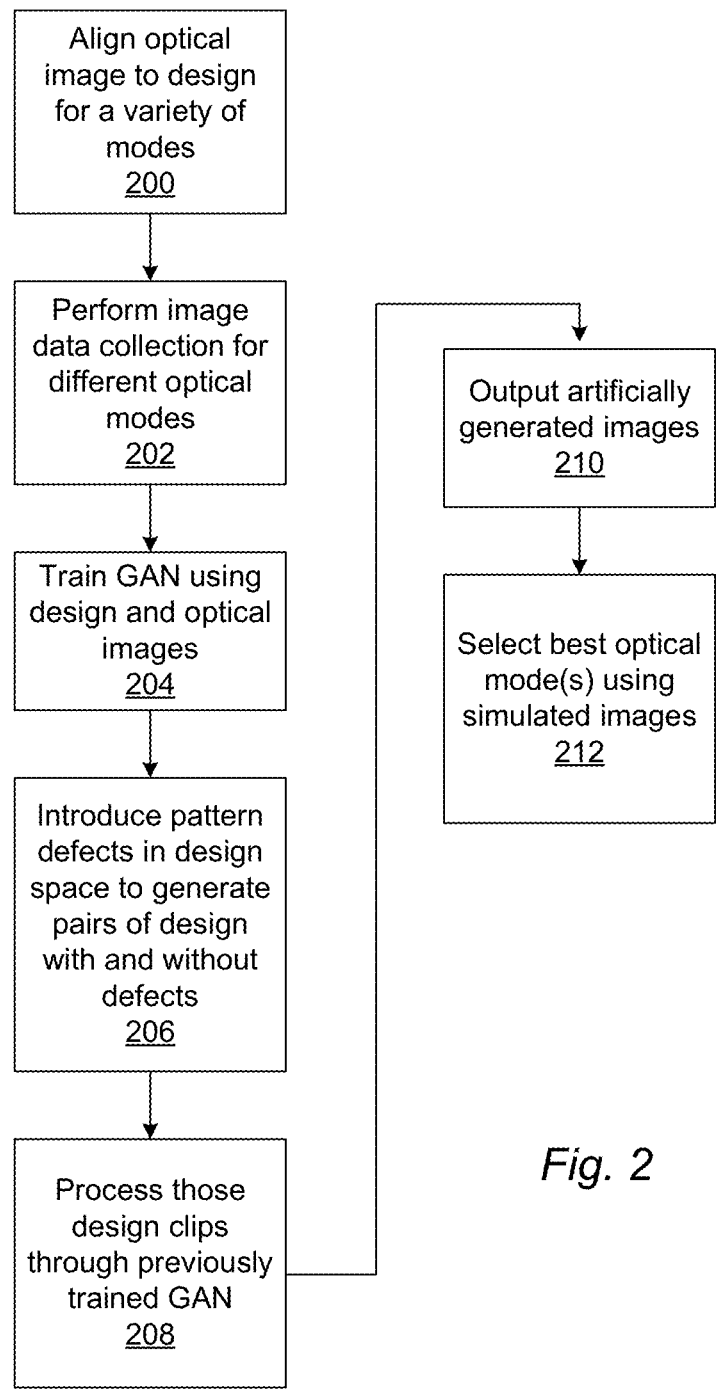
FIGS. 2-4 are flow charts illustrating steps that may be performed by the embodiments described herein.

FIG. 2 shows one potential flow of optical or other mode selection using a GAN or a cGAN for generating optical or other images using a variety of different optical or other modes. Some steps that may be performed by the one or more computer subsystems to train the GAN are shown in FIG. 2. Although FIG. 2 shows steps that may be performed in a method for using a GAN for data augmentation, some of the steps shown in FIG. 2 may be performed for other applications as well. For example, steps 200, 202, and 204 may be performed to train a GAN regardless of which of the applications described herein the GAN will be used for.

As shown in step 200, the computer subsystem(s) may align optical image to design for a variety of modes of the tool. Such alignment may be performed using pixel-to-design alignment (PDA) or another suitable alignment method. If the GAN is being trained for a different kind of image, the optical image(s) may be replaced in the steps shown in FIG. 2 with another type of (e.g., electron beam) image. PDA may be performed in any suitable manner known in the art, some examples of which are described in the above-referenced patent to Kulkarni et al. PDA may be performed for any one or more alignment target(s) on the specimen to thereby determine image-to-design offsets, which can then be used by the computer subsystem(s) to identify which portion of a design for the specimen corresponds to an image generated for the specimen.

As shown in step 202, the computer subsystem(s) may perform image data collection for different optical modes of the tool. Although some steps are described in FIG. 2 with respect to "optical modes," the steps shown in this figure may also or alternatively be performed for any other mode selection described herein (e.g., electron or ion beam mode selection). Image data collection may include running a hot scan or a targeted location scan for all (or at least some) of the different modes to obtain pairs of optical image and design clip. A "design clip" as that term is used herein is generally defined as a relatively small portion of an entire design for a specimen. The term "design clip" is used interchangeably herein with the phrase "portion of design data."

The hot scan may be performed in any suitable manner known in the art. In general, a "hot" scan involves scanning a specimen and detecting events on the specimen using a "hot" threshold, e.g., a threshold that is at, near, or even in the noise floor of the output generated by the scanning. When the data collection is performed using a hot scan, the tool may scan a (relatively large) preselected area on the specimen, up to even an entirety of the specimen. In contrast, for targeted location scanning, only a preselected number of discrete areas on the specimen may be scanned. The preselected discrete areas may be selected in any manner such as based on areas of interest on the specimen, areas at which DOIs are possibly located, areas at which DOIs are not expected, etc.

When data collection includes a targeted location scan, the targeted locations may be imaged with or without applying a threshold or defect detection method or algorithm to the images. The threshold or defect detection method or algorithm may be the same as that used in a hot scan or may be a different threshold or defect detection method or algorithm. Any hot scan performed for data collection may for the purposes described herein also not necessarily include applying a threshold to the images generated by the scanning. In addition, the data collection performed in step 202 may include some combination of a hot scan and a targeted location scan.

For any events that are detected in the data collection, the computer subsystem(s) may create pairs of optical images and their corresponding design clips. The pairs may be created for only some or all of the events detected in the data collection. In general, the pairs may be created for fewer than all of the events because hot scans generally will detect many more events than are needed for any one application. The computer subsystem(s) may sample or select which events are used to create image and design clip pairs in any suitable manner. The image and design clip pairs may also be created for locations at which no events were detected. In this manner, the image and design clip pairs may be for "good" locations on the specimen(s). In some such embodiments, the data collection may not detect events on the specimen(s) at all, but may simply collect images that can then be paired with corresponding design clips. Whether for events or not, the corresponding images and design clips can be identified and paired using the image-to-design offsets described above.

The image and design clip pairs generated by step 202 may then be used as a training set, with the design clips designated as the training inputs and corresponding images designed as the training outputs, in step 204 in which the GAN (i.e., the generator-discriminator network (NW)) is trained using design and optical images. The training of the GAN may be performed as described further herein. In some embodiments, the computer subsystem(s) may be configured to perform steps 200, 202, and 204. Alternatively, different computer subsystem(s) or system(s) may be configured to perform steps 200, 202, and 204. For example, a first computer subsystem may be configured to generate the training set by performing steps 200 and 202, a second computer subsystem may be configured to train the GAN in step 204, and the first and second computer subsystems may or may not be included in the computer subsystem(s) of the embodiments described herein.

The training may include inputting the training inputs into the GAN and altering one or more parameters of the GAN until the output produced by the GAN matches (or substantially matches) the training outputs. Training may include altering any one or more trainable parameters of the GAN. The one or more parameters of the GAN that are trained may include one or more weights for any layer of the GAN that has trainable weights. In one such example, the weights may include weights for convolution layers but not pooling layers.

As mentioned above, the one or more components that are executed by the one or more computer subsystems include a deep generative model, e.g., GAN 106 shown in FIG. 1. Generally speaking, "deep learning" (DL) (also known as deep structured learning, hierarchical learning or deep machine learning) is a branch of machine learning (ML) based on a set of algorithms that attempt to model high level abstractions in data. In a simple case, there may be two sets of neurons: ones that receive an input signal and ones that send an output signal. When the input layer receives an input, it passes on a modified version of the input to the next layer. In a DL-based model, there are usually many layers between the input and output (and the layers are not made of neurons but it can help to think of it that way), allowing the algorithm to use multiple processing layers, composed of multiple linear and non-linear transformations.

DL is part of a broader family of ML methods based on learning representations of data. An observation (e.g., an image) can be represented in many ways such as a vector of intensity values per pixel, or in a more abstract way as a set of edges, regions of particular shape, etc. Some representations are better than others at simplifying the learning task (e.g., face recognition or facial expression recognition). One of the promises of DL is replacing handcrafted features with efficient algorithms for unsupervised or semi-supervised feature learning and hierarchical feature extraction.

A "generative" model can be generally defined as a model that is probabilistic in nature. In other words, a "generative" model is not one that performs forward simulation or rule-based approaches and, as such, a model of the physics of the processes involved in generating an actual image is not necessary. Instead, as described further herein, the generative model can be learned (in that its parameters can be learned) based on a suitable training set of data. The generative model may be configured to have a DL architecture, which may include multiple layers that perform a number of algorithms or transformations. The number of layers included in the generative model may be use case dependent. For practical purposes, a suitable range of layers is from 2 layers to a few tens of layers. Deep generative models that learn the joint probability distribution (mean and variance) between the specimen images (e.g., images of actual wafer) and design (e.g., CAD or a vector representation of intended layout) can be configured as described further herein.

In one embodiment, the deep generative model is a GAN. In another embodiment, the deep generative model is a cGAN. The deep generative model may also include any other suitable type of GAN known in the art.

In general, GANs consist of two adversarial models, a generative model, G, capturing the data distribution, and a discriminative model, D, estimating the probability that a given sample comes from the training data rather than G. G and D could be a multi-layer perceptron, i.e. a non-linear mapping function. The generator builds a mapping function from a prior noise distribution $p_z(Z)$ to the data space $G(z; \theta_g)$ in order to learn a generator distribution $p_g$ over the data x where G is a differentiable function represented by a multilayer perceptron with parameters $\theta_g$. The generator is trained to produce simulated output that cannot be distinguished from the real data distribution or ground truth data distribution. The adversarially trained discriminator is trained to detect fakes which are created by the generator. Both the generator and the discriminator are trained as good as possible so that the generator produces extremely good "faked" output.

When extending GANs to a conditional model (cGAN), the discriminator and the generator are both conditioned on some extra information, y, by feeding y into the discriminator and the generator as an additional input layer.

GANs are inspired by game theory where a generator G and a critic, i.e., Discriminator D, are competing with each other to make each other stronger. The goal is to make the generated data distribution $p_g$ as similar as possible to the real sample distribution $p_r$ evaluated by the Jensen-Shannon divergence:

$$D_{JS}(p_g \| p_r) = \frac{1}{2} D_{KL}\left(p_g \| \frac{p_g + p_r}{2}\right) + \frac{1}{2} D_{KL}\left(p_r \| \frac{p_g + p_r}{2}\right)$$

where $D_{KL}$ is the Kullback-Leibler divergence defined as follows:

$$D_{KL}\left(p_g \| \frac{p_g + p_r}{2}\right) = \int_{x_1}^{x_2} p_g(x) \log \frac{2 p_g(x)}{p_g(x) + p_r(x)} dx \text{ and}$$

$$D_{KL}\left(p_r \| \frac{p_g + p_r}{2}\right) = \int_{x_1}^{x_2} p_r(x) \log \frac{2 p_r(x)}{p_g(x) + p_r(x)} dx$$

The generator outputs synthetic samples given a random noise variable input z. Over time, the generator gets trained to capture the real data distribution by having the discriminator reject images which it considers as being bad fakes.

For conditional GANs, the Generator and Discriminator are conditioned on some extra information, y, which will be the design clip in the embodiments described herein. The following minimax game with the objective L(D,G) is describing the setting:

$$\min_G \max_D L(D, G) = \mathbb{E}_{x \sim p_r(x)}(\log D(x|y)) + \mathbb{E}_{z \sim p_z(z)}(\log(1 - D(G(z|y)))) =$$
$$\mathbb{E}_{x \sim p_r(x)}(\log D(x|y)) + \mathbb{E}_{x \sim p_g(x)}(\log(1 - D(x|y)))$$

This means that G is trained to increase chances of D producing a high probability for a faked example, thus minimizing $\mathbb{E}_{x \sim p_g(x)}(\log(1-D(x|y)))$. We also need to make sure that the discriminator decisions over real data are accurate by maximizing the encoding $\mathbb{E}_{x \sim p_r(x)}(\log D(x|y))$ and given a fake sample G(z), the discriminator is expected to output a probability, D(G(z)), close to zero by maximizing $\mathbb{E}_{z \sim p_z(z)}(\log(1-D(G(z|y))))$.

Figure 3:
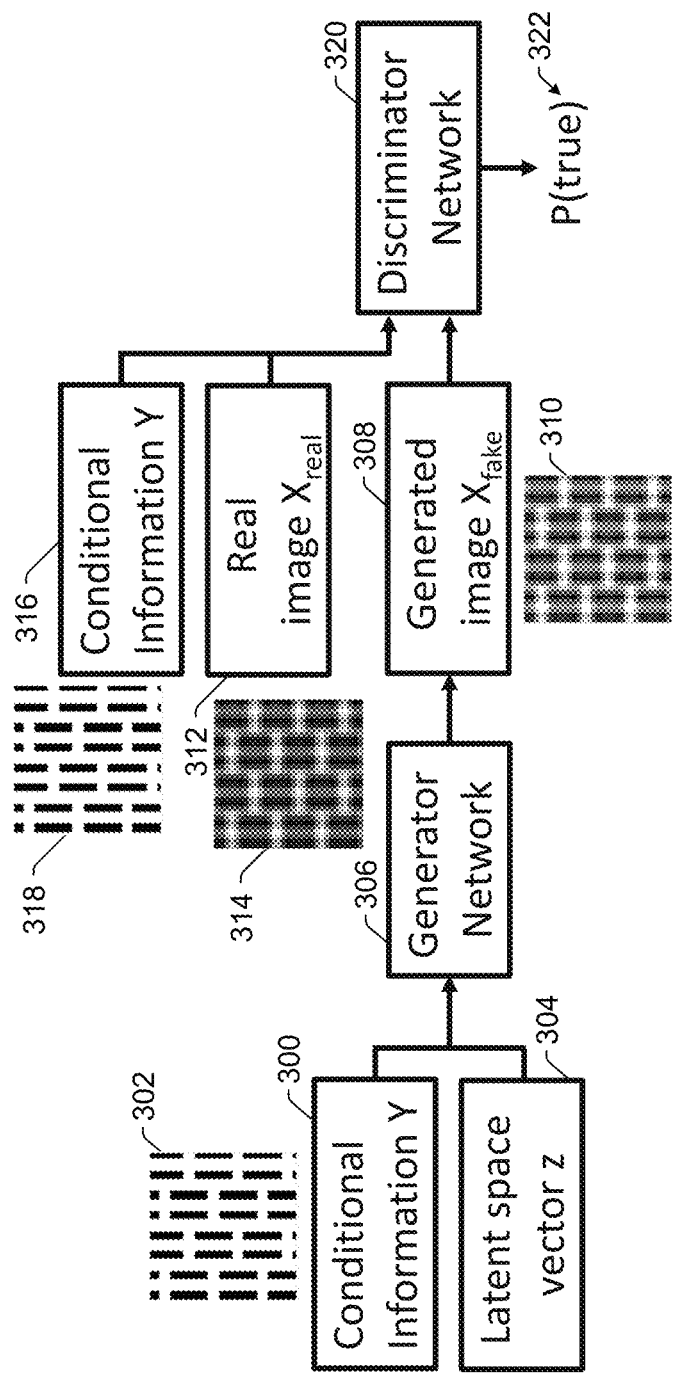

FIG. 3 shows cGAN training performed by providing the generator network with a design image. In particular, as shown in FIG. 3, conditional information Y 300 (extra data such as design image 302 or a conditional image) is input to generator network 306 along with latent space vector z 304. As a result, generator network 306 outputs generated image $X_{fake}$ 308, which is a simulated specimen image, e.g., simulated specimen image 310. Real image $X_{real}$ 312, in this case, is actual optical image 314 of a specimen at a location on the specimen at which the portion of the design shown in design image 302 is formed. In this manner, conditional information Y 300 such as a design image may be a training input in a training set, and real image $X_{real}$ 312 may be its corresponding image of a specimen designated as a training output in the training set.

The latent space vector may have any suitable configuration known in the art. In general, the latent space vector represents an initial image that simply consists of noise, i.e., pixels with randomly assigned grey level values. For computational reasons, this image is stored as a vector by stitching each row in the image next to each other so that a 2D image, e.g., 32 pixels by 32 pixels, becomes a correspondingly sized vector, e.g., a 1×1024 sized vector. Some information (e.g., color) may be added to this randomness to guide the deep generative model into a certain direction.

Generated image $X_{fake}$ 308 and conditional information Y 300 are combined as a first input to discriminator network 320. Real image $X_{real}$ 312 and conditional information Y 316, (e.g., design image 318) are combined as a second input to discriminator network 320. Conditional information Y 300 and 316 are different instances of the same portion of the same design in this case. The discriminator network may generate output that is input to a loss function (not shown), which may produce output P(True) 322, which is the probability that the generated patch image is a true or good "faked" image.

Each of the design, real, and generated images shown in the figures is not meant to illustrate any particular specimen(s) or characteristics thereof for which the embodiments described herein may be used. In a similar manner, each of the real and generated images shown in the figures is not meant to illustrate any particular actual or simulated images that may be generated for specimen(s). Instead, the design, real, and generated images shown in the figures are merely intended to promote understanding of the embodiments described herein. The images actually input and output from the generator will vary depending on the specimen and its characteristics, which are related to its design, and the configuration of the tool that generates the actual images for the specimen(s), which are used to train the GAN thereby affecting the simulated images that are generated by the GAN.

The loss function may be any suitable loss function known in the art such as that disclosed by Isola et al., in "Image-to-Image Translation with Conditional Adversarial Networks," The IEEE Conference on Computer Vision and Pattern Recognition (CVPR), 2017, pp. 1125-1134, which is incorporated by reference as if fully set forth herein. The embodiments described herein may be further configured as described in this reference. The generator and discriminator networks shown in FIG. 3 may be further configured as described herein.

Figure 5:
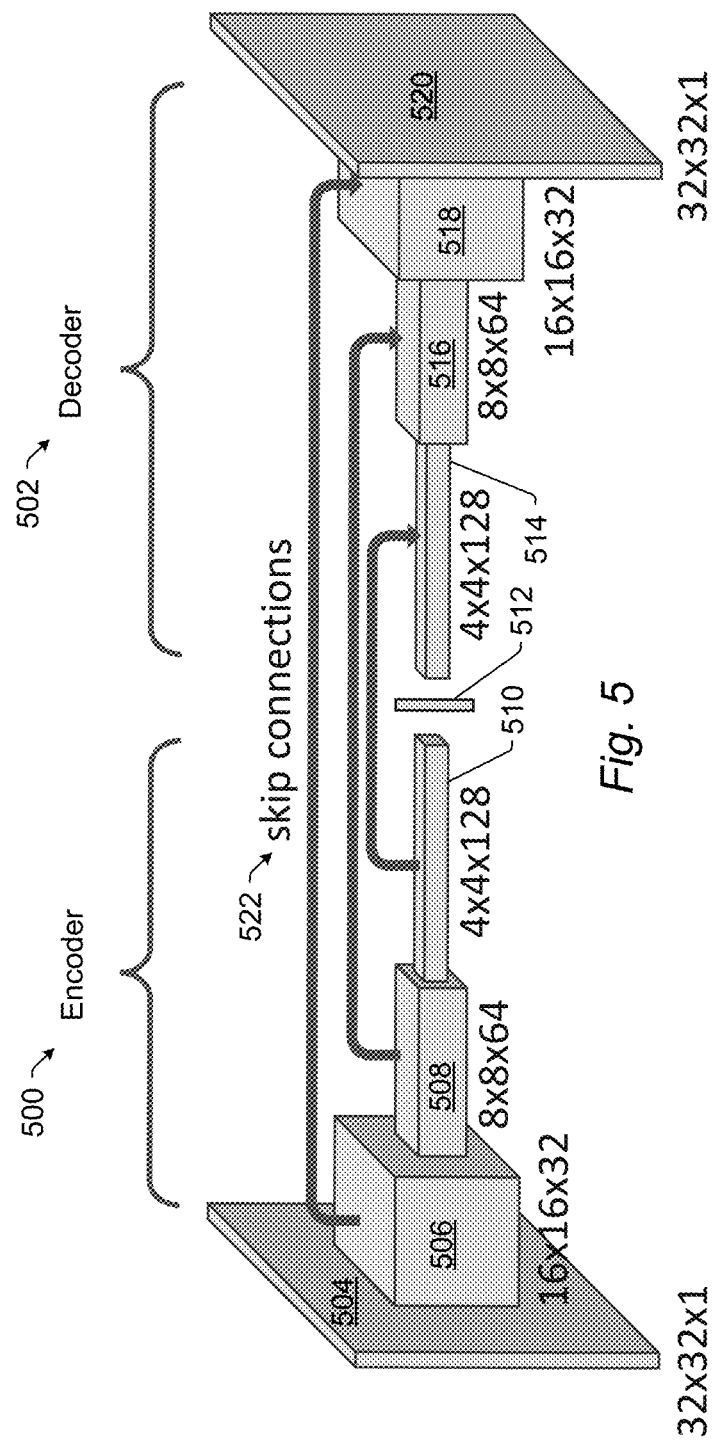
FIG. 5 is a schematic diagram illustrating one example of a generator that may be included in an embodiment of a generative adversarial network (GAN)

An example of a generator that may be included in embodiments of a GAN configured as described herein is shown in FIG. 5. In general, the GAN may include an encoder-decoder network that is progressively down sampling until a bottle neck layer and then the process is reversed. As shown in FIG. 5, the generator may include encoder 500 and decoder 502. Each of the blocks 506, 508, and 510 shown in encoder 500 represent an example of final output layer size after repeated convolution, batch normalization, and rectified linear unit (ReLU) activation and applying max pooling in the end of each section. Although encoder 500 is shown in FIG. 5 as including 3 blocks, the encoder may include any suitable number of blocks, which may be determined in any suitable manner known in the art. In addition, each of the blocks, convolution layer(s), batch normalization layer(s), ReLU layer(s), and pooling layer(s) may have any suitable configuration known in the art. Input 504, which is in the embodiments described herein a portion of design data, may be input into block 506, whose output may be input to block 508, and so on. The encoder may generate feature layer 512.

The decoder may also include multiple blocks that perform different functions on feature layer 512 input to the decoder. Each of blocks 514, 516, and 518 in the decoder represent an example of final output layer size after repeating upsampling (transposed convolution) and ReLU activation. Although decoder 502 is shown in FIG. 5 as including 3 blocks, the decoder may include any suitable number of blocks, which may be determined in any suitable manner known in the art. Each of the blocks and upsampling and ReLU layer(s) included in the decoder may have any suitable configuration known in the art. Feature layer 512 generated by the encoder may be input to block 514, whose output may be input to block 516, and so on. Output 520 of the decoder may be any of the simulated images described herein.

In some instances, the GAN may include skip connections 522 between corresponding blocks in the encoder and decoder, e.g., between blocks 506 and 518, between blocks 508 and 516, and between blocks 510 and 514. Connections can be skipped to transfer low-level information that has been learned between the blocks. The skip connections may have any suitable configuration determined in any suitable manner known in the art. The numbers below the input and output in FIG. 5 indicate the size of the input and output, respectively. The numbers below the blocks in the encoder indicate the size of the outputs of the blocks, and the numbers below the blocks in the decoder indicate the size of the inputs to each of the blocks.

Figure 6:
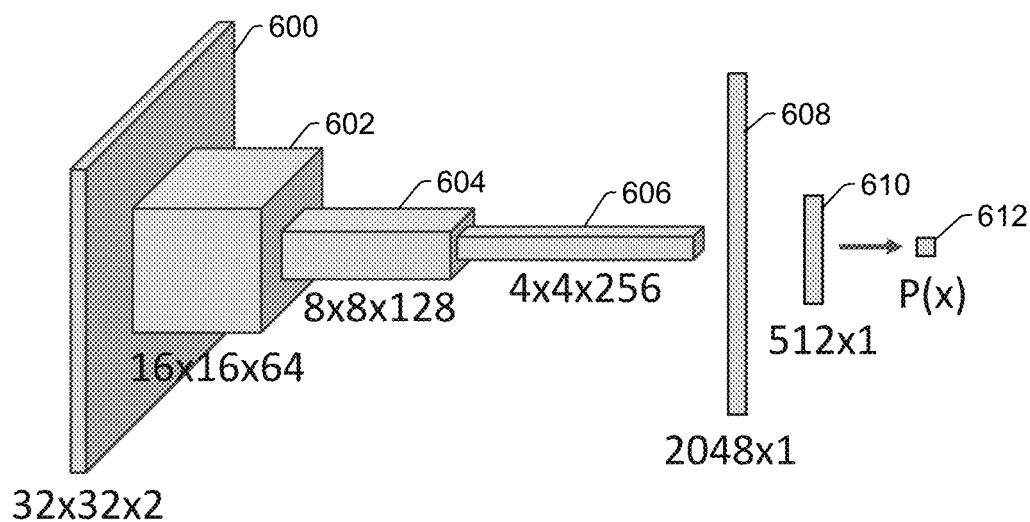
FIG. 6 is a schematic diagram illustrating one example of a discriminator that may be included in an embodiment of a GAN.

An example of a discriminator that may be included in embodiments of a GAN configured as described herein is shown in FIG. 6. Input 600 to the discriminator may include two images (not shown in FIG. 6), one generated by the generator of the GAN and the original image. The discriminator may include a number of layers including layers 602, 604, 606, 608, and 610, each of which may include some combination of convolution, ReLU, and max pooling layers. The convolution, ReLU, and max pooling layers may have any suitable configuration known in the art. Output 612 of the discriminator may be P(x), the probability of how well the simulated image matches the original image or the probability that the simulated image is a good "faked" image or a bad "faked" image. The numbers below the input in FIG. 6 indicate the size of the input. The numbers below the layers in the discriminator indicate the size of the outputs of the layers. Although the discriminator is shown in FIG. 6 with a particular number of layers, the discriminator included in the GANs of the embodiments described herein may have any suitable number of layers determined in any suitable manner known in the art.

The deep generative model may be a GAN, a cGAN, or any other suitable type of GAN known in the art. Additional description of the general architecture and configuration of GANs and cGANs can be found in U.S. patent application Ser. No. 17/170,688 by Brauer filed Jan. 8, 2021 and Ser. No. 17/308,878 by Brauer et al. filed May 5, 2021 and in "Generative Adversarial Nets," Goodfellow et al., arXiv: 1406.2661, Jun. 10, 2014, 9 pages, "Semi-supervised Learning with Deep Generative Models," Kingma et al., NIPS 2014, Oct. 31, 2014, pp. 1-9, "Conditional Generative Adversarial Nets," Mirza et al., arXiv:1411.1784, Nov. 6, 2014, 7 pages, "Adversarial Autoencoders," Makhzani et al., arXiv:1511.05644v2, May 25, 2016, 16 pages, and "Image-to-Image Translation with Conditional Adversarial Networks," Isola et al., arXiv:1611.07004v2, Nov. 22, 2017, 17 pages, which are incorporated by reference as if fully set forth herein. The embodiments described herein may be further configured as described in these references.

Although some embodiments are described herein (only for the sake of clarity and simplicity) as generating "simulated images" for a specimen, the GANs described herein may be used to generate any number of simulated images limited only by the portions of design data input to the GANs. In addition, although some embodiments are described herein (again only for the sake of clarity and simplicity) as generating simulated images for "a specimen," the embodiments described herein are not limited to generating simulated images for only one specimen. In some embodiments, generating simulated images for only one specimen may be all that is required when the simulated images are augmented defect images that are used to select mode(s).

In one embodiment, the simulated images are simulated optical images. In this manner, the simulated images illustrate how the specimen appears in actual images generated by an optical imaging tool such as an optical inspection tool. As such, the simulated images may represent (e.g., correspond, simulate, or approximate) images that may be generated of the specimen by an optical imaging tool. Such simulated optical images may be used in a variety of ways described further herein. One novel feature of the embodiments described herein is therefore that they provide a method for improved optical mode selection using a GAN or cGAN for the artificial creation of optical patch images.

In another embodiment, the specimen for which the simulated images are generated is not included in one or more specimens used for training the GAN. For example, the one or more specimens that are used to generate the training data that is then used to train a GAN may be different from the specimen for which the GAN is used to generate simulated images. In this manner, the training data may be generated using one or more training specimens, and the simulated images may be generated for a "mode setup" specimen. The training specimen(s) and the mode setup specimen may be the same type of specimens, e.g., they may have the same design and may have been processed using the same fabrication process step(s), although as described further herein that is not necessarily always the case. In addition, the trained GAN may be used for generating simulated images for more than one mode setup specimen.

In a further embodiment, a design for the specimen for which the simulated images are generated is different than one or more designs for one or more specimens used to train the GAN. For example, as described above, the specimen for which the simulated images are generated may not be the same as (or included in) one or more specimens used to train the GAN. In general, the one or more specimens used to train the GAN and the specimen for which the images are simulated may have the same design and may have been processed in the same processes (and therefore be of the same "layer"). Training the GAN in such a manner will ensure that the simulated image(s) most closely resemble the actual images.

But in some cases, a first specimen may have similar enough characteristics (e.g., patterned features, materials, etc.) to a second specimen, that a GAN trained on the first specimen can be used to generate simulated images for the second specimen even if the first and second specimens do not have the same designs. In such cases, the simulated images that are generated by the trained GAN may be for the same optical mode as that for which it was trained. In other words, as described further herein, a GAN that is trained for generating simulated images produced by one imaging mode may not necessarily be suitable for generating simulated images produced by another imaging mode. Therefore, if two specimens that have at least some similarities in at least a portion of their designs are or will be imaged in the same manner, one of the specimens may be used to train the GAN and the trained GAN may be used to generate simulated images for another of the specimens.

In this manner, a trained GAN may be repurposed for generating simulated images for specimens it was not necessarily trained for. In one such example, if two different specimens with two different designs have at least some patterned features in common in a portion of the design (e.g., similar memory array areas) formed of similar materials and having the same or similar dimensions, a GAN trained for one of the specimens may be capable of producing simulated images in that portion of the design for another of the specimens. Even if a GAN trained for one specimen is not capable of producing simulated images for another specimen having a different design, if there are some similarities among the specimens, the trained GAN may be used as a starting configuration that is re-trained for another specimen to create a different GAN. Such re-training may be performed as described herein.

Since the computer subsystem(s) input an artificially defective portion of the design into the GAN, in one embodiment, the simulated images include an augmented defect image of a synthetic defect. In this manner, the simulated images illustrate how a synthetic defect appears in one or more actual images generated by a tool such as an inspection tool. As such, the simulated image(s) may represent (e.g., correspond, simulate, or approximate) image(s) that may be generated of the synthetic defect(s) by the inspection or other tool. A "synthetic" defect as that term is used herein is generally defined as a defect that is artificially created in a design for a specimen in one of several manners described herein. Therefore, a "synthetic" defect is not a defect that has been detected on a specimen although its characteristics may be determined based on such a detected defect. Instead, such a "synthetic" defect is created in a design for a specimen through the intentional manipulation of an otherwise defect free portion of the design. When such a manipulated portion of the design is input to a trained GAN described herein, the resulting simulated image is referred to as an "augmented" defect image since the simulated specimen image has been augmented with a defect that is not actually present on the specimen.

Figure 4:
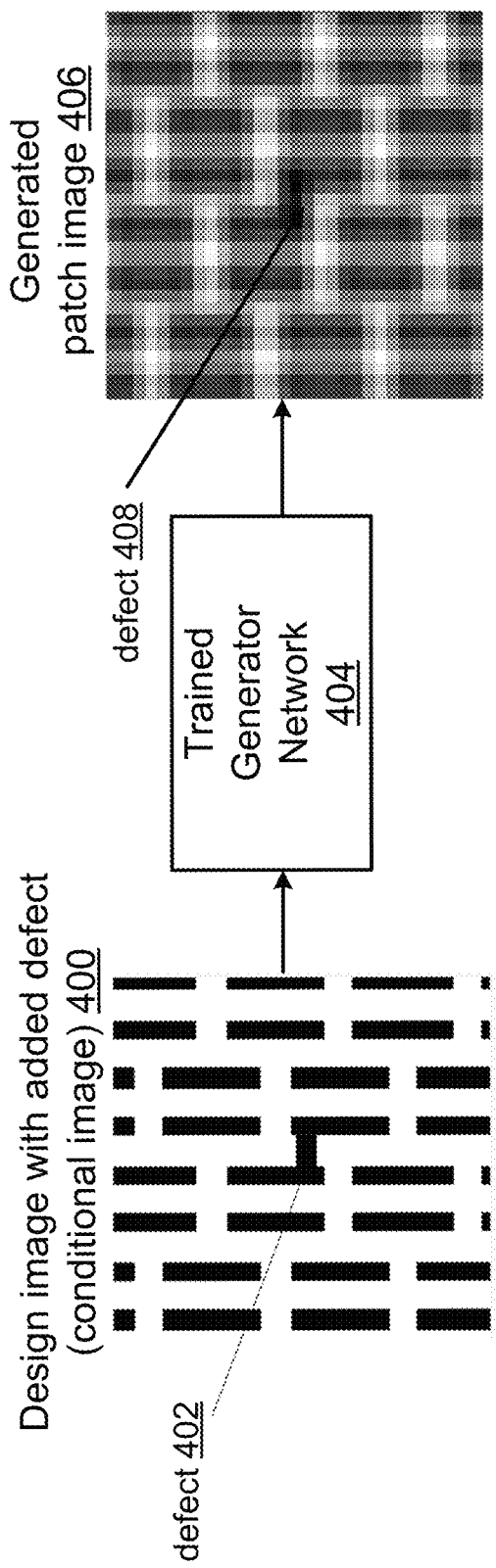

FIG. 4 illustrates one embodiment of steps that may be performed for artificial image generation using a GAN. In particular, as shown in FIG. 4, the one or more computer subsystems may input design image 400 (conditional image) with added defect 402 into trained generator network 404. The added or synthetic defect may be created in the design data portion shown in design image 400 as described further herein by the one or more computer subsystems. The trained generator network may output generated patch image 406 showing defect 408. In this manner, the synthetic defect is added defect 402 in the portion of design data shown in design image 400, which is input to the GAN by the one or more computer subsystems to thereby generate simulated image 406.

As shown in FIG. 4, therefore, once the GAN is trained, the GAN can be used to generate simulated optical or other images. In this embodiment, the trained generator network is used to create a patch, real-looking image of an artificially introduced defect in a design clip. The generated patch images can then be used as described further herein.

In one such embodiment, a number of actual defects detectable on the specimen is insufficient for selecting the mode for the process. For example, the embodiments described herein can be used to generate simulated images that are augmented defect images of synthetic defect(s) that can then be used for mode selection, which is particularly advantageous when the number of DOI events is limited which is very often the case. Another advantage of the embodiments described herein is therefore that they enable mode selection even when the original number of DOI examples is substantially low. The embodiments described herein also advantageously enable mode selection when there are no DOI examples available; e.g., as described further herein, when there are no optical images of a DOI at all, simulated images may be generated by the embodiments described herein based on knowledge of how the DOI is supposed to look in design space within design clip(s), and those simulated images may then be used for mode selection.

The one or more computer subsystems are configured for modifying a portion of design data for a specimen to generate an artificially defective portion of the design data. Although some embodiments are described herein (only for the sake of clarity and simplicity) as modifying "a portion" of design data for a specimen, the computer subsystem(s) described herein may modify any number of design data portions for any number of DOIs. For example, the one or more computer subsystems may be configured for generating the artificially defective portion of the design data by modifying original design data for the specimen with a synthetic defect. In some instances, the one or more computer subsystems may select DOI candidates from a scanning electron microscope (SEM) reviewed hot scan and locate them in design. In one such example, if a hot scan is performed for GAN training, events detected by the hot scan may be sampled and then sent for defect review, e.g., by a SEM or another suitable defect review tool. The defect review is performed to determine which of the sampled events are actual defects and which are nuisances and to determine a defect type or classification of the actual defects. In this manner, defect review may determine which of the detected events are DOIs and identify the type or classification of the DOI (when it is possible that different types of DOIs may be present on a specimen). Such DOI discovery and identification is an optional step since, in some cases, a user will know what type(s) of DOI(s) they are interested in. For example, a chip manufacturer will usually know what defects they are looking for.

As shown in step 206 of FIG. 2, the one or more computer subsystems may introduce pattern defects in design space to generate pairs of design (design portions or design images) with and without defects. If the specimen for which the augmented defect images are being generated has the same design as the one or more specimens used for training the GAN, then the design clips used for steps 200, 202, and 204 may also be used for step 206. If the specimen for which the augmented defect images are being generated has a different design than the one or more specimens used for training the GAN, then the design clips used for steps 200, 202, and 204 may be different from those used for step 206.

In either case, however, any information for the DOI(s) that are detected on a specimen may be used in step 206 to create design clip(s) that are modified to include the DOI(s). For example, if a bridge type DOI is detected on a specimen, the original design data for the specimen may be modified by the computer subsystem(s) to include bridge type structure(s) at the location at which the bridge type DOI was detected as well as location(s) in the design that are different than the location at which the bridge type DOI was detected. The location(s) at which the DOI is created in a design may be selected based on the types of patterned features located at or near the detected DOI, e.g., so that the modified design clip and the original design clip at the location of a detected DOI contain the same or at least similar patterned structures (similar in shape, dimensions, spacing relative to each other, orientation, etc.). In one example, if a bridge type DOI is detected between two patterned features having a particular orientation and spacing relative to each other, a bridge type patterned feature may be created at any one or more other locations in the design containing the same two patterned features having the same relative orientation and spacing. Such locations may be identified in any suitable manner, e.g., by pattern searching the original design based on the image of the detected DOI or the original, defect-free design clip at the location of the detected DOI.

Modifying the original design data for the specimen may be performed as described herein using an electronic design automation (EDA) tool. The EDA tool may include any suitable commercially available EDA tool. In addition, modifying the original design data as described herein can be automated with a programmable/graphical EDA editor, which may include any suitable EDA software, hardware, system, or method. In some such embodiments, one or more of the computer subsystems described herein (e.g., computer subsystem(s) 102) may be configured as an EDA tool or may be a computer subsystem included in an EDA tool.

If the original design data (e.g., computer-aided design (CAD)) for the specimen is available, it is straightforward to inject "legal," synthetic defect examples. For example, DOIs such as opens, shorts, "mouse bites," protrusions, etc. can be rendered (drawn) with various sizes, which could be automated based on descriptions of the DOIs. Using an EDA tool, these rendered DOIs can be located in "legal" places in the geometry instead of in random places. In one example, a short is a metal connection between two copper lines. For such a DOI, one could simply add a small short line at strategic pinch points in the design. When a user such as a chip manufacturer knows what defects they are looking for, they could also manually draw them in the design file.

Modifying the original design data for the specimen with the synthetic defect as described herein may also be performed using an inception module configured for altering the design to create the synthetic defect in the design. For example, a neural network may be trained by a defect hallucination system such as those suggested by GoogLeNet inception for natural scene images. A traditional neural network that is pre-trained on defects can then play these backwards to create new defect types on other geometry structures. Examples of systems and methods for performing GoogLeNet inception can be found in "Going Deeper with Convolutions," Szegedy et al., 2015 IEEE Conference on Computer Vision and Pattern Recognition (CVPR), June 2015, 9 pages, which is incorporated by reference as if fully set forth herein. The embodiments described herein may be further configured as described in this reference.

In some such embodiments, the one or more computer subsystems are configured for determining one or more characteristics of the synthetic defect based on one or more defects detected on one or more specimens. For example, as described above, in some instances, events may be detected on one or more specimens used for generating the training set that is used to train the GAN, and DOI(s) may be identified and selected from among those events. Information for the DOI(s) may then be used to determine one or more characteristics of the synthetic defects. Such information may include any information that is or can be determined for the DOI(s) such as location, size, shape, orientation, texture or roughness, patterned feature(s) on which the DOI(s) are located, patterned feature(s) in which the DOI(s) are located, patterned feature(s) located near the DOI(s), etc. Such information may be determined or generated by the inspection tool that detected the events, a review tool that re-detected the events and identified one or more of them as DOI(s), a metrology tool that measures one or more characteristics of the identified DOI(s), or some combination thereof. For example, as described above, pattern searching may be performed based on a defect image or its corresponding design clip to find other similar instances of a pattern in a design, and then the design for those other instances may be modified as described herein to create the DOI(s) at those other instances. Other DOI characteristic(s) such as those described above may also be used to create the modified design (e.g., in the case of a bridge type DOI, the dimensions, orientation, roughness, etc. of the bridge type structure). Therefore, the original design for the specimen may be modified based on one or more characteristics of one or more DOI(s) detected on the specimen(s) used to generate the training set.

In another embodiment, the one or more computer subsystems are configured for determining one or more characteristics of the artificially defective portion of the design data without information for one or more actual defects detected on the specimen. In an additional embodiment, modifying the portion of the design data for the specimen is performed based on information for a DOI on the specimen, and no actual instances of the DOI are detectable on the specimen in a setup scan performed by the tool prior to modifying the portion of the design data. For example, even if there are no DOI examples at all, the one or more computer subsystems can modify a design clip for the specimen by introducing a defect in it and input the modified design clip into the GAN to create the corresponding patch image that can then be used for mode selection. Trying to find examples of DOIs when there are few or even none present on a specimen can create a significant bottleneck in many methods that rely on DOI examples. The difficulty in finding DOI examples for mode selection can also be particularly difficult since the mode(s) used for trying to find the DOI examples may be completely unsuitable for defect detection since "good" modes are not necessarily known until mode selection has been performed. This situation presents a kind of chicken and egg problem for mode selection—how do you find DOI examples without knowing which modes are good for defect detection and how do you know which modes are good without having DOI examples to figure that out? A fundamental difference between the embodiments described herein and previously used methods and systems for mode selection is therefore that the embodiments described herein can be used for mode selection without any DOI examples at all. One novel feature of the embodiments described herein therefore is that they provide improved mode selection by modifying a design file by introducing a defect in it and using a GAN or cGAN for generating a corresponding optical patch image even when there are no defect examples at all.

When there are no defect examples at all, the one or more characteristics of the synthetic defect may be determined in various possible ways. For example, as described above, in many instances in which the embodiments described herein may be used, a user may have knowledge about which types of DOI(s) are of interest to them. Such knowledge may be based on the types of DOI(s) typically seen on specimens produced in the same or similar process(es) as the specimen for which the simulated images are generated. Such prior knowledge may be acquired experimentally, heuristically, theoretically, etc. For example, even when designs of specimens are substantially different, certain patterned structures that may be in each of the designs may be prone to certain type(s) of DOI(s). In one particular example, alternating line/space patterns in which the lines and spaces are relatively small in width may be prone to bridging type defects formed between the lines. Therefore, when a user sees such a pattern group in a new design, they may surmise that bridging type defects may be present in such patterns and therefore may create such defects in the design for the specimen. The design clips created artificially for such defects may then be input to the GAN by the computer subsystem(s) described herein to thereby generate simulated images for the defects.

In some embodiments, modifying the portion of the design data for the specimen is performed based on information for a DOI on the specimen known to be altered by repeated imaging by the tool. For example, in some print check applications, in which a wafer is printed with a pattern and then inspected to find defects that are used to identify defects on a reticle or mask used to print the pattern on the wafer, defect examples on the wafer can be burned after collecting data using only one mode of the tool. The embodiments described herein may therefore be particularly useful for selecting modes for print check application inspections. Therefore, one advantage of the embodiments described herein is that even if there are no DOI examples at all or they get altered by the tool, mode selection can still be performed using the simulated images generated as described herein.

The one or more computer subsystems are configured for generating simulated images for the specimen by inputting the portion of the design data and the artificially defective portion of the design data into the GAN. The computer subsystem(s) may be configured to input the original and artificially defective portions of the design data for the specimen into the GAN in any suitable manner known in the art. In one such example, as shown in step 208, the one or more computer subsystems may process the design clips generated by step 206 through the previously trained GAN. The trained GAN may then output artificially generated images, as shown in step 210. The images output by the GAN in step 210 may be used as input data for selecting best optical mode(s) using simulated images, as shown in step 212, which may be performed as described further herein.

In a further embodiment, the one or more computer subsystems are configured for modifying an additional portion of the design data to generate an additional artificially defective portion of the design data, determining one or more characteristics of the artificially defective portion of the design data based on information for a first DOI on the specimen, and determining one or more characteristics of the additional artificially defective portion of the design data based on information for a second DOI on the specimen. In one such embodiment, generating the simulated images includes inputting the additional portion of the design data and the additional artificially defective portion of the design data into the GAN or an additional GAN. For example, the embodiments described herein can advantageously be used to easily generate simulated images for different DOI type examples. In other words, the GANs described herein can generate simulated images for different types of DOIs in the same design for the same specimen.

Many of the specimens described herein may have multiple types of DOIs present on them, and the user may be interested in more than one (or even all) of those multiple types of DOIs. Different DOIs may have substantially different characteristics. For example, bridge type defects can have substantially different characteristics than pinhole type defects, but both types of defects may be present on a specimen and possibly of interest to a user. Different types of DOIs may be located in different portions of the design or in the same portion of the design. Therefore, a design clip that is modified as described herein to include a synthetic defect may include a single synthetic defect or multiple synthetic defects. Regardless of the number of synthetic defects in a modified design clip and/or the number of modified design clips, which may be for multiple instances of the same DOI type and/or for different DOI types, a GAN trained as described herein will be capable of producing substantially high quality simulated images for each of the DOI types and for each DOI instance.

In another embodiment, the one or more computer subsystems are configured for modifying an additional portion of the design data to generate an artificially nuisance portion of the design data and determining one or more characteristics of the artificially nuisance portion of the design data based on information for a nuisance on the specimen, and generating the simulated images includes inputting the additional portion of the design data and the artificially nuisance portion of the design data into the GAN or an additional GAN. For example, the same GANs that are used to generate simulated images for artificially defective portions of design data may also be used to predict the signal of known nuisance examples in different modes to find not simply the mode with the strongest signal but also with the best DOI-nuisance separation.

The modifications to the additional portion of the design data for a nuisance may be determined in a variety of ways. For example, for a given process or tool, a user may know what characteristics of the specimen tend to cause nuisance detection. Some common examples of specimen characteristics that are known to cause nuisances in inspection processes include line edge roughness (LER), line end shortening (LES), relatively small variations in CD, film thickness variations, and the like. Therefore, based on such knowledge, the user or a computer subsystem can determine modifications to one or more portions of the design that would cause such changes on the specimen that would then cause nuisances to be detected on the specimen. In this manner, portions of the design that may or tend to cause nuisances to be detected on the specimen in the process can be modified to include such changes to the design pattern, the modified portions of the design can be input by the computer subsystem(s) to the GAN as described herein, and characteristic(s) of the simulated images generated for these modified portions of the design may be determined and used for mode selection as described further herein.

In some instances, the artificially nuisance portions of the design may simply include original portions of the design (unmodified) that are known to tend to cause nuisance detection. For example, some patterns in a design for the specimen may be associated (through prior knowledge about the patterns, the specimen, or the process, through modeling, etc.) with higher nuisance detection than others. Those patterns in the design may therefore (without modification) be used to simulate images that represent actual images that cause nuisance detection. In this manner, characteristics of these simulated images may be determined as described herein and used as examples of nuisance characteristics that may be detected during the process. Those characteristics may also be used as described further herein for mode selection.

In addition to generating simulated images for artificially nuisance portions of the design data and/or for portions of the design data that tend to cause nuisance detection, the one or more computer subsystems may also generate simulated images for known good portions of the design, which may or may not be the portions of the design data prior to modification or other portions of the design data that are not modified in some way. For example, it may be useful for mode selection to have simulated images that both include and do not include a DOI to see if the characteristic(s) of both images are such that the images with and without the DOI can be differentiated from each other. In this manner, the characteristic(s) of the images can be used to both detect a DOI when it is present on a specimen and not detect a DOI when it is not present. As such, the simulated images may be used to determine if the process can distinguish between the presence and absence of a DOI on a specimen. In inspection processes, it is not simply enough that all DOIs are detected, but it is also important to not erroneously detect DOIs when they are not there. In this manner, generating simulated images both for DOIs and non-DOI containing portions of the design may be advantageous for some applications described herein.

In one embodiment, the GAN is trained to generate the simulated images for a first mode of the tool, and generating the simulated images for the specimen includes inputting the portion of the design data and the artificially defective portion of the design data into an additional GAN trained to generate the simulated images for a second mode of the tool. In such embodiments, therefore, different GANs may be trained to produce images or other output for different modes. In particular, in most cases, different modes of an inspection or other imaging tool will produce images and/or output that are different from each other in one of several possible ways, e.g., noise levels, contrast, resolution, image type (e.g., DF vs. BF, optical vs. electron beam, etc.), and the like. Therefore, if a GAN is trained to produce output or images for one mode of a tool, chances are it will be unsuitably trained to produce output or simulated images for another mode of the tool. As such, multiple GANs may be separately and independently trained, one for each mode of interest. The same pre-trained GAN network may however be used for each mode although that is not necessary. Each of the multiple GANs may be trained as described herein. For example, to collect images for training on print check wafers, the embodiments described herein may collect the same images across different reticles but for different optical modes. For each mode, an independent neural network may then be trained using the images collected with that mode. Each trained GAN may then be used to generate a mode specific data set. In this manner, each model may then be used to create images of the defects for each of the optical modes. The input to each differently trained GAN, however, may be the same design clips or different portions of the same design and the same modified portions of the design since the design of the specimen and the DOIs will not change from mode to mode.

In another embodiment, the GAN is trained to generate the simulated images for different modes of the tool. Right now, there may be one conditional input (let's call it Y1) for the GAN which is the design. But this may be modified so that there is also a second conditional input (let's call it Y2)

to let the GAN know what optical mode we are interested in. Of course, this additional conditional input may be input to the GAN during both training and inference time. Another way that a single GAN may be configured for generating images for multiple modes may be to design a network that is able to read in a higher dimensional input. Currently, the input to the GAN may be the design which has only a 0 for the pixels that has no polygon and a 1 if the pixel has a polygon. Instead of that, the mode information may be encoded for input as follows by marking the value for a polygon in case of mode 1 with (1, 1), for mode 2 as (1, 2), for mode 3 as (1, 3) and so on. This way we have one conditional input Y but it has one additional dimension which is the mode. Now we would also add another dimension to the image matrix so that we could store several modes of a given image in one matrix. Such a GAN configuration/implementation may be computationally more expensive than using multiple GANs for multiple modes. This GAN implementation also assumes that all the optical images are aligned to each other. Such multi-mode image alignment may also be a substantial amount of work but it is doable, for example as described in U.S. Patent Application Publication No. 2021/0097704 by Brauer et al. published Apr. 1, 2021, which is incorporated by reference as if fully set forth herein. The embodiments described herein may be further configured as described in this publication.

The one or more computer subsystems are configured for determining one or more characteristics of the simulated images. The one or more characteristics of the simulated images may be determined for any or all of the modes for which simulated images were generated. The one or more characteristics may vary depending on the process for which the mode is being selected. For example, if a mode is being selected for an inspection process, the one or more characteristics determined for the simulated images may be one or more characteristics of the images that will affect how well DOIs can be detected and/or how well nuisances can be suppressed (i.e., not detected at all or able to be separated from DOIs by filtering, classification, or another process step). Some such characteristics are described further herein. If a mode is being selected for a metrology process, the one or more characteristics determined for the simulated images may be one or more characteristics of the images that will affect how well the metrology process can determine information for patterned features in the images from the characteristic(s). Such characteristics may include image characteristics such as resolution, contrast, brightness, and the like. If a mode is being selected for a defect review process, the one or more characteristics determined for the simulated images may be similar to those for inspection processes but also possibly similar to those for metrology processes (e.g., since defect review is not only performed for re-detecting the defects but also typically for determining information for the defects that could not be determined by inspection).

The one or more characteristics may therefore be determined using a method or algorithm that will be used in the process, like a defect detection algorithm or method, a metrology algorithm or method, or a defect review algorithm or method. The one or more characteristics may, also or alternatively, be determined using any other suitable image characterization algorithm or method that quantifies or qualifies the characteristic(s) of the images like resolution, contrast, brightness, etc. In general, therefore, the one or more characteristics of the simulated images that are determined by the embodiments described herein may be any characteristics that provide information for how well the modes image the specimen and/or how useful the images generated by the modes are for the process and may be determined using any suitable method or algorithm known in the art.

In one embodiment, determining the one or more characteristics includes subtracting one of the simulated images generated for the portion of the design data from one of the simulated images generated for the artificially defective portion of the design data thereby generating a difference image and determining one or more characteristics of the difference image. For example, the images output by the GAN in step 210 of FIG. 2 include artificially generated test and reference images. The test images would be the images generated from the artificially defective design portions, and the reference images would be the images generated from the original design portions. In this manner, the artificially generated images include both images that include the defect and images that do not. Those images may then be subtracted as they might normally be in defect detection, and one or more characteristics of the resulting difference images may be determined. Those resulting difference images may be particularly suitable for determining one or more characteristics that are used as described further herein for mode selection since they may be representative of how well or how poorly the artificially introduced defect can be detected from such images if they were generated by the tool.

In one such embodiment, the determined one or more characteristics of the difference image include signal-to-noise value of the difference image. Therefore, one advantage of the embodiments described herein is that defect signal-to-noise calculations can be performed based on GAN generated images. Since the simulated images are being generated for an artificially defective portion of the design data, the portion of the difference images where the synthetic defect is located will be known a priori. Therefore, the signal of that portion of the difference image may be used to determine the signal portion of the signal-to-noise value, and the portion of the difference image surrounding (partially or completely surrounding) the synthetic defect portion of the difference image may be used to determine the noise portion of the signal-to-noise value. In this manner, when the determined one or more characteristics of the difference image are signal-to-noise values, they are responsive to the differences between the portion of the difference image corresponding to the synthetic defect and the portions of the difference image that do not correspond to the synthetic defect and therefore how well the difference image can be used to detect the defects on actual specimens.

The one or more computer subsystems are configured for selecting a mode of a tool used for a process performed on the specimen based on the determined one or more characteristics. For example, when the one or more determined characteristics include signal-to-noise values, the selecting step may include finding the mode that has the highest signal-to-noise values for the images and selecting that mode for the process. In one such example, the signal-to-noise values of the GAN generated difference images may be calculated as described herein, and the best modes may be ranked based on the signal-to-noise values thereby enabling easy identification of the best mode or modes for use in the process. Ranking the modes based on the signal-to-noise values may be performed in any suitable manner known in the art. For example, in one embodiment, the simulated images are generated for different modes of the tool, the one or more characteristics are determined for the simulated images generated for the different modes of the tool, and selecting the mode of the tool based on the determined one or more characteristics includes comparing the one or more characteristics determined for the simulated images generated for the different modes of the tool. In this manner, by comparing the one or more determined characteristics for different modes of the tool, the modes can be ranked from best mode (e.g., the mode that has the best signal-to-noise values) to worst mode (e.g., the mode that has the worst signal-to-noise values). Other characteristic(s) determined for the simulated images may be used to rank the modes in a similar manner (from the best values for the characteristic(s) to the worst values of the characteristic(s)).

When more than one characteristic is determined for each of the modes, ranking the modes based on the multiple characteristics may become more complicated than using a single characteristic. However, in some instances, it may be important to consider multiple characteristics for mode selection (e.g., when multiple characteristics, like both signal-to-noise value and contrast, contribute to the success of the process). In such instances, rather than ranking the modes based on the individual characteristics (and generating multiple rankings for each mode), a score may be generated using the multiple characteristics thereby generating a single value used to rank the modes from best to worst. Generating such a score may be advantageous because the score may be generated using a relationship based on the characteristics that takes into account the relative importance of the different characteristics, can normalize one characteristic to another or others, can transform some values of the characteristics so that they trend in the same direction as other characteristics (e.g., so that higher values for multiple characteristics indicate better performance by a mode and vice versa, rather than some characteristics indicating better performance when higher while other characteristics indicating better performed when lower), etc. For example, in some instances, signal-to-noise values may be more important than resolution even when resolution and signal-to-noise values both affect inspection. In this case, scores may be determined for each of the modes based on the signal-to-noise values and resolution but with the signal-to-noise values weighted more heavily than the resolution values. In other cases, resolution may be more important than signal-to-noise value even though both affect the process and so the weights described above could be reversed.

Using signal-to-noise values for the mode selection step may be advantageous when the process is inspection. For example, signal-to-noise values of portions of the simulated images corresponding to the artificially defective portions of the design data may correlate nicely to how well each of the modes under consideration can detect defects on the specimen. Therefore, by identifying and selecting a mode that has the highest or substantially high signal-to-noise values for those portions of the simulated images, a mode that can detect DOIs on the specimen can be identified and selected. In addition, as described further herein, simulated images may also be generated for artificially nuisance portions of the design data or portions of the design data known to cause nuisance detection. In this manner, the simulated images can be used to determine which mode or modes provide the greatest separation between the characteristics for the DOIs and the nuisance. In other words, a mode that generates images for DOIs that have one or more determined characteristics that are most different from one or more characteristics determined for images generated for nuisances or non-defective portions of the design or specimen will provide the best separation between DOIs and nuisances. Such a mode will therefore have the best DOI capture rate with the best nuisance suppression. Suppressing nuisance detection while successfully capturing DOIs is important so that any process decisions made based on the results of the inspection are made based on the DOIs and not any nuisances erroneously detected as defects. In this manner, one advantage of the embodiments described herein is that the presented approach or a derivation of it allows for the reduction of nuisance detected in the process performed on the specimen, which in turn allows semiconductor manufacturers to make more reliable process decisions.

Another advantage of the embodiments described herein is derived from the fact that the GANs described herein can be trained using actual specimen images generated from different modes of the tool. In particular, as described further herein, the embodiments may collect images and design clips for a variety of modes. By collecting data directly from the specimen or another specimen of the same type and using that data for GAN training, the GANs trained from such data will generate simulated images that are responsive to specimen conditions which are not ideal (e.g., variation in optical responses across the specimen due to specimen variations such as thickness variations, line edge roughness, and the like). Therefore, the mode(s) that are selected for the process performed on the specimen based on the simulated images will also be responsive to real specimen conditions that are perhaps less than ideal. This ability to take into account real specimen conditions is particular to the deep generative models described herein and differentiates the embodiments described herein from other ways to generate simulated specimen images such as electromagnetic modeling of the tool hardware. For example, electromagnetic models are only capable of using the theoretical model without taking into consideration any real specimen conditions and any real process variability.

Since the embodiments described herein can advantageously take into consideration any real specimen conditions and any real process variability, the embodiments described herein can also be used as a kind of inline optics selector, which is something that is completely new and can be particularly helpful because the processes performed by the tools described herein can be adversely affected by process/specimen variability (e.g., losing defect detection sensitivity to DOI) without a user even knowing. In one such embodiment, the one or more computer subsystems are configured for retraining the GAN with images of an additional specimen generated by the tool thereby generating a retrained GAN, the specimen and the additional specimen are the same type, and the one or more computer subsystems are further configured for generating additional simulated images for the additional specimen by inputting the portion of the design data and the artificially defective portion of the design data into the retrained GAN, determining one or more characteristics of the additional simulated images, and selecting a mode of the tool used for the process performed on the additional specimen based on the determined one or more characteristics of the additional simulated images. The specimen and the additional specimen may be of the same type in that they have the same design. Retraining the GAN may be performed in the same manner as described herein with respect to training except that the starting point is the already trained GAN and the images used for retraining are different than those used for training. Generating the additional simulated images, determining one or more characteristics of the additional simulated images, and selecting the mode of the tool performed in this embodiment may be performed as described further herein.

In this manner, the additional images generated for the additional specimen may be generated with a relatively limited scan (e.g., a couple of swaths) and a limited or predetermined number of optical modes (e.g., 5) of the tool. Those images can be used to retrain the GAN (or different GANs for different modes, respectively) so that it produces (or they produce) artificial defect images that are good approximations of what actual defect images on the additional specimen would look like in the different modes. The computer subsystem(s) may then perform signal-to-noise analysis (or other image analysis described herein) based on the GAN generated images for each individual mode to determine if the best optical mode for inspecting (or otherwise processing) the additional specimen (and any other additional specimens) has changed due to altering processing conditions (which as described below could be intentionally altered or inadvertently altered). Therefore, such inline optics selector (or optics selection performed after a process has been released for use) is made possible by the fact that the embodiments described herein make it substantially easy to determine the best optical mode, even when there are not any defect examples, just by scanning an area on a specimen and training or retraining the GAN to generate artificial defect images for that specimen.

In one such embodiment, the one or more computer subsystems are configured for performing the retraining after a fabrication process performed on the specimen and the additional specimen has been intentionally changed. In another such embodiment, the one or more computer subsystems are further configured for performing the retraining after a fabrication process performed on the specimen has been performed on a predetermined number of specimens. For example, the GAN retraining (and other steps described above) may be performed by the one or more computer subsystems when a user knowingly changes a fabrication process performed on specimens of the same type as the specimen for which the mode(s) were initially selected and/or after a predetermined number of specimens have been processed in the fabrication process (e.g., after every 25 wafers which is usually the number of wafers that is in one lot or one front opening unified port (FOUP)).

In another embodiment, selecting the mode of the tool includes selecting more than one mode of the tool for the process based on the determined one or more characteristics. For example, some processes performed on the specimens described herein using the tools described herein may be performed using a combination of modes that may be selected because they are complementary in some fashion. In this manner, the embodiments described herein may be used to find the best secondary, tertiary, etc. mode for multimode inspections and other multimode processes in addition to the best primary mode.

For multimode inspection processes, the multiple modes may be complementary in a few different ways. One such way is that the results of the defect detections performed using each selected mode may be additive. In one such example, one mode may be particularly sensitive to one type of DOI and another mode may be particularly sensitive to another type of DOI, and the DOIs detected by each mode may be combined to provide inspection results for the specimen. In another such example, one mode may be particularly sensitive to a DOI located in one pattern in the design, and another mode may be particularly sensitive to the DOI located in a different pattern in the design. The DOIs detected in both modes may also be combined into one inspection result. Another such way is that the results of the defect detection performed using each selected mode may not necessarily be additive but may be complementary. For example, one mode may be particularly good at detecting a DOI but may also be not so good at suppressing nuisance. However, if another mode is good at detecting nuisance but really poor at detecting DOIs, that mode may not be classically good for inspection, but may be particularly useful at identifying nuisances detected by the other mode, which is better at DOI detection. In this manner, the nuisances detected by one mode may be used to suppress nuisances detected in another mode. A further way that the results of defect detection can be performed using multiple modes is that the defect detection algorithm or method uses the characteristic(s) of images generated with multiple modes to make a decision as to whether a defect is present or not. In effect, therefore, a kind of multi-dimensional threshold may be applied to the output generated by multiple modes of the tool, with possibly no single mode of the tool used separately for defect detection.

As noted above, the impetus for using more than one mode for an inspection is generally that the inspection is relatively difficult to begin with, e.g., the DOIs are relatively difficult to separate from noise and/or the nuisances are relatively difficult to suppress. For such inspections, ideally, two or more modes would be complementary in some manner, e.g., such that the results produced by one mode could enhance the results produced by another mode. In one such example, even if the results produced by one mode are not in of themselves particularly "good," in the right circumstances, those results could be used to separate DOIs and nuisances in other results produced by another mode thereby enhancing the results produced by the other mode.

In this manner, the modes may be used in a different manner than two mode detection. In other words, the primary mode may be used for detection, and the secondary mode may be used for separation of the events detected by the primary mode into defects (or DOIs) and nuisances. In some such instances, when the secondary mode is used only for separation purposes, the inspection tool may simply position its field of view on a location-by-location basis at the reported locations of the defect candidates that have been detected in the primary mode to collect new output (e.g., image information, etc.) for them with the secondary mode. In this manner, the inspection tool may be configured to perform output generation at only discrete locations on the specimen at which events were detected on the specimen with the primary mode rather than performing a re-scan of the entire area of the specimen scanned with the primary mode. As such, the inspection tool may perform output generation in a move-acquire-measure manner with the secondary mode. In such inspection processes then, the primary and secondary modes may be used sequentially, first for a scan of the entire inspected area on the specimen and then for targeted output generation at the locations of the detected events. In addition, the inspection process may not necessarily include generating output with the secondary mode at the location of every event detected with the primary mode. For example, results generated with the secondary mode at the locations of some of the events detected with the primary mode may be used to filter out other events detected with the primary mode. In another example, a preliminary filtering of the events detected with the primary mode may be performed to separate any events that are obviously defects or obviously nuisances, and the secondary mode may then be used to generate output at the remaining events that could not be obviously separated.

The embodiments described herein are however obviously not limited in the inspection process for which mode selection can be performed. In other words, the embodiments described herein can be used for mode selection of any inspection process, including single mode inspection processes. In addition, the inspection process for which the modes are selected using the embodiments described herein may include inspection processes in which multiple modes perform detection and the collective results are used to perform separation ("multi-mode detection"), in which multiple modes are used to scan an entire area of the specimen either simultaneously or separately, inspection processes that use more than two modes, etc.

For multimode metrology processes, the multiple modes may also be complementary in that one mode may be particularly useful for determining one characteristic of the specimen while another mode may be particularly useful for determining another characteristic of the specimen using both the images generated with that mode and the characteristic determined using the other mode. For example, one mode may be particularly sensitive to film thickness. The film thickness and the images generated using another mode may then be used to determine another characteristic of the specimen such as CD. In this manner, the characteristics of the simulated images determined as described herein may be used to determine which mode or modes are best for metrology.

For multimode defect review processes, the multiple modes may be complementary in the same fashions described above for inspection. In this manner, different modes may be evaluated using the simulated images described herein, and the one or more characteristics determined for the multimode simulated images may be used to select one mode or multiple modes for defect review.

Whether one mode or multiple modes are selected in the mode selection step described herein may be determined based on the simulated images generated as described herein. For example, when it is found that a single mode of an inspection tool generates images that can both detect DOIs with substantially high capture rates and suppress nuisances at substantially high rates, the one or more computer subsystems may determine that the single mode is sufficient for the process. In contrast, when such a single mode cannot be found by the one or more computer subsystems, the computer subsystem(s) may eliminate the single mode option and begin evaluation of different combinations of modes, which may be performed as described further herein. In this manner, based on whether a single mode can be found that can meet the performance goals set by a user (e.g., a specified DOI capture rate and/or a specified nuisance suppression rate), the computer subsystem(s) may select a single mode or try to find multiple modes that can meet those performance goals. In this manner, the computer subsystem(s) may provide flexibility in the mode selection step while also attempting to find the simplest mode selection possible for the process.

The simulated images that are generated as described herein are also not specific to any particular mode selection described herein or elsewhere. For example, another advantage of the embodiments described herein is that the simulated images may be used in any mode selection process and may be combined with any other actual images or other information that may aid in the mode selection process. Some examples of mode selection that may be performed using the simulated images described herein can be found in commonly assigned U.S. Pat. No. 9,702,827 to Brauer et al. issued Jul. 11, 2017, U.S. Pat. No. 10,115,040 to Brauer issued Oct. 30, 2018, U.S. Pat. No. 10,964,016 to Brauer issued Mar. 30, 2021, and U.S. Pat. No. 11,010,885 to Brauer et al. issued May 18, 2021, all of which are incorporated by reference as if fully set forth herein. The embodiments described herein may be further configured as described in these patents.

In some embodiments, the computer subsystem(s) are configured for storing information for the selected one or more modes for use in a process such as an inspection process performed on the specimen by the tool. The computer subsystem(s) may be configured to store the information in a recipe or by generating a recipe for the process in which the selected mode(s) will be used. A "recipe" as that term is used herein can be generally defined as a set of instructions that can be used by a tool to perform a process on a specimen. In this manner, generating a recipe may include generating information for how a process is to be performed, which can then be used to generate the instructions for performing that process. The information for the selected one or more modes that is stored by the computer subsystem(s) may include any information that can be used to identify and/or use the selected mode(s) (e.g., such as a file name and where it is stored, and the file may include information for the modes such as mode names, mode parameter values, etc.).

The computer subsystem(s) may be configured for storing the information for the selected mode(s) in any suitable computer-readable storage medium. The information may be stored with any of the results described herein and may be stored in any manner known in the art. The storage medium may include any storage medium described herein or any other suitable storage medium known in the art. After the information has been stored, the information can be accessed in the storage medium and used by any of the method or system embodiments described herein, formatted for display to a user, used by another software module, method, or system, etc. For example, the embodiments described herein may generate an inspection recipe as described above. That inspection recipe may then be stored and used by the system or method (or another system or method) to inspect the specimen or other specimens to thereby generate information (e.g., defect information) for the specimen or other specimens.

The one or more computer subsystems and/or the inspection tool may be configured to use the results of the selecting step to perform the inspection process on the specimen and/or other specimens of the same type. Such an inspection process may produce results for any defects detected on the specimen(s) such as information, e.g., location, etc., of the bounding boxes of the detected defects, detection scores, information about defect classifications such as class labels or IDs, etc., or any such suitable information known in the art. The results for the defects may be generated by the computer subsystem(s) and/or inspection tool in any suitable manner. The results for the defects may have any suitable form or format such as a standard file type. The computer subsystem(s) and/or inspection tool may generate the results and store the results such that the results can be used by the computer subsystem(s) and/or another system or method to perform one or more functions for the specimen(s) or another specimen of the same type.

Results and information generated by performing the process on the specimen and/or other specimens of the same type may be used in a variety of manners by the embodiments described herein and/or other systems and methods. Such functions include, but are not limited to, altering a process such as a fabrication process or step that was or will be performed on the inspected specimen or another specimen in a feedback or feedforward manner. For example, the computer subsystem(s) described herein may be configured to determine one or more changes to a process that was performed on a specimen inspected as described herein and/or a process that will be performed on the specimen based on the detected defect(s). The changes to the process may include any suitable changes to one or more parameters of the process. The computer subsystem(s) described herein preferably determine those changes such that the defects can be reduced or prevented on other specimens on which the revised process is performed, the defects can be corrected or eliminated on the specimen in another process performed on the specimen, the defects can be compensated for in another process performed on the specimen, etc. The computer subsystem(s) described herein may determine such changes in any suitable manner known in the art. Such changes may also be determined using results of other processes described herein.

Those changes can then be sent to a semiconductor fabrication system (not shown) or a storage medium (not shown) accessible to the computer subsystem(s) and the to semiconductor fabrication system. The semiconductor fabrication system may or may not be part of the system embodiments described herein. For example, the computer subsystem(s) and/or tool described herein may be coupled to the semiconductor fabrication system, e.g., via one or more common elements such as a housing, a power supply, a specimen handling device or mechanism, etc. The semiconductor fabrication system may include any semiconductor fabrication system known in the art such as a lithography tool, an etch tool, a chemical-mechanical polishing (CMP) tool, a deposition tool, and the like.

As described herein, therefore, the embodiments can be used to setup a new process or recipe. The embodiments may also be used to modify an existing process or recipe, whether that is a process or recipe that was used for the specimen or was created for one specimen and is being adapted for another specimen.

Each of the embodiments of each of the systems described above may be combined together into one single embodiment.

Another embodiment relates to a computer-implemented method for selecting a mode of a tool used for a process performed on a specimen. The method includes modifying a portion of design data for a specimen to generate an artificially defective portion of the design data. The method also includes generating simulated images for the specimen by inputting the portion of the design data and the artificially defective portion of the design data into a GAN included in one or more components executed by one or more computer systems. In addition, the method includes determining one or more characteristics of the simulated images and selecting a mode of a tool used for a process performed on the specimen based on the determined one or more characteristics. The modifying, generating, determining, and selecting steps are performed by the one or more computer systems.

Each of the steps of the method may be performed as described further herein. The method may also include any other step(s) that can be performed by the system, computer system(s), component(s), and/or GANs described herein. The computer system(s) may be configured according to any of the embodiments described herein, e.g., computer subsystem(s) 102. The one or more components and the GAN may also be configured according to any of the embodiments described herein. The method may be performed by any of the system embodiments described herein.

Figure 7:
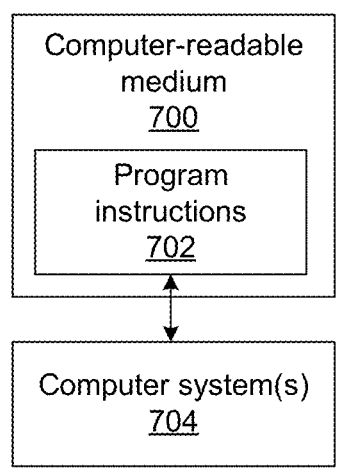
FIG. 7 is a block diagram illustrating one embodiment of a non-transitory computer-readable medium storing program instructions for causing computer system(s) to perform a computer-implemented method described herein.

An additional embodiment relates to a non-transitory computer-readable medium storing program instructions executable on one or more computer systems for performing a computer-implemented method for selecting a mode of a tool used for a process performed on a specimen. One such embodiment is shown in FIG. 7. In particular, as shown in FIG. 7, non-transitory computer-readable medium 700 includes program instructions 702 executable on computer system(s) 704. The computer-implemented method may include any step(s) of any method(s) described herein.

Program instructions 702 implementing methods such as those described herein may be stored on computer-readable medium 700. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system(s) 704 may be configured according to any of the embodiments described herein.

Further modifications and alternative embodiments of various aspects of the invention will be apparent to those skilled in the art in view of this description. For example, methods and systems for selecting a mode of a tool used for a process performed on a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to select a mode of a tool used for a process performed on a specimen, comprising:
   one or more computer subsystems; and
   one or more components executed by the one or more computer subsystems, wherein the one or more components comprise a generative adversarial network; and
   wherein the one or more computer subsystems are configured for:
      modifying a portion of design data for a specimen to generate an artificially defective portion of the design data;
      generating simulated images for the specimen by inputting the portion of the design data and the artificially defective portion of the design data into the generative adversarial network;
      determining one or more characteristics of the simulated images; and
      selecting a mode of a tool used for a process performed on the specimen based on the determined one or more characteristics.

2. The system of claim 1, wherein the generative adversarial network is configured as a conditional generative adversarial network.

3. The system of claim 1, wherein the generative adversarial network is trained with images of the specimen or another specimen of the same type as the specimen generated by the tool and the design data for the specimen or the other specimen.

4. The system of claim 1, wherein the generative adversarial network is trained to generate the simulated images for a first mode of the tool, and wherein generating the simulated images for the specimen comprises inputting the portion of the design data and the artificially defective portion of the design data into an additional generative adversarial network trained to generate the simulated images for a second mode of the tool.

5. The system of claim 1, wherein the generative adversarial network is trained to generate the simulated images for different modes of the tool.

6. The system of claim 1, wherein the simulated images are generated for different modes of the tool, wherein the one or more characteristics are determined for the simulated images generated for the different modes of the tool, and wherein selecting the mode of the tool based on the determined one or more characteristics comprises comparing the one or more characteristics determined for the simulated images generated for the different modes of the tool.

7. The system of claim 1, wherein selecting the mode of the tool comprises selecting more than one mode of the tool for the process based on the determined one or more characteristics.

8. The system of claim 1, wherein determining the one or more characteristics comprises subtracting one of the simulated images generated for the portion of the design data from one of the simulated images generated for the artificially defective portion of the design data thereby generating a difference image and determining one or more characteristics of the difference image.

9. The system of claim 8, wherein the determined one or more characteristics of the difference image comprise signal-to-noise value of the difference image.

10. The system of claim 1, wherein a number of actual defects detectable on the specimen is insufficient for selecting the mode for the process.

11. The system of claim 1, wherein the one or more computer subsystems are further configured for determining one or more characteristics of the artificially defective portion of the design data without information for one or more actual defects detected on the specimen.

12. The system of claim 1, wherein modifying the portion of the design data for the specimen is performed based on information for a defect of interest on the specimen, and wherein no actual instances of the defect of interest are detectable on the specimen in a setup scan performed by the tool prior to modifying the portion of the design data.

13. The system of claim 1, wherein modifying the portion of the design data for the specimen is performed based on information for a defect of interest on the specimen known to be altered by repeated imaging by the tool.

14. The system of claim 1, wherein the one or more computer subsystems are further configured for modifying an additional portion of the design data to generate an additional artificially defective portion of the design data, determining one or more characteristics of the artificially defective portion of the design data based on information for a first defect of interest on the specimen, and determining one or more characteristics of the additional artificially defective portion of the design data based on information for a second defect of interest on the specimen, and wherein generating the simulated images comprises inputting the additional portion of the design data and the additional artificially defective portion of the design data into the generative adversarial network or an additional generative adversarial network.

15. The system of claim 1, wherein the one or more computer subsystems are further configured for modifying an additional portion of the design data to generate an artificially nuisance portion of the design data and determining one or more characteristics of the artificially nuisance portion of the design data based on information for a nuisance on the specimen, and wherein generating the simulated images comprises inputting the additional portion of the design data and the artificially nuisance portion of the design data into the generative adversarial network or an additional generative adversarial network.

16. The system of claim 1, wherein the one or more computer subsystems are further configured for retraining the generative adversarial network with images of an additional specimen generated by the tool thereby generating a retrained generative adversarial network, wherein the specimen and the additional specimen are the same type, and wherein the one or more computer subsystems are further configured for generating additional simulated images for the additional specimen by inputting the portion of the design data and the artificially defective portion of the design data into the retrained generative adversarial network, determining one or more characteristics of the additional simulated images, and selecting a mode of the tool used for the process performed on the additional specimen based on the determined one or more characteristics of the additional simulated images.

17. The system of claim 1, wherein the one or more computer subsystems are further configured for performing the retraining after a fabrication process performed on the specimen and the additional specimen has been intentionally changed.

18. The system of claim 1, wherein the one or more computer subsystems are further configured for performing the retraining after a fabrication process performed on the specimen has been performed on a predetermined number of specimens.

19. The system of claim 1, wherein the tool is a light based inspection tool.

20. The system of claim 1, wherein the tool is an electron based inspection tool.

21. The system of claim 1, wherein the specimen is a wafer.

22. A non-transitory computer-readable medium, storing program instructions executable on one or more computer systems for performing a computer-implemented method for selecting a mode of a tool used for a process performed on a specimen, wherein the computer-implemented method comprises:

modifying a portion of design data for a specimen to generate an artificially defective portion of the design data;

generating simulated images for the specimen by inputting the portion of the design data and the artificially defective portion of the design data into a generative adversarial network included in one or more components executed by the one or more computer systems;

determining one or more characteristics of the simulated images; and selecting a mode of a tool used for a process performed on the specimen based on the determined one or more characteristics.

23. A computer-implemented method for selecting a mode of a tool used for a process performed on a specimen, comprising:

modifying a portion of design data for a specimen to generate an artificially defective portion of the design data;

generating simulated images for the specimen by inputting the portion of the design data and the artificially defective portion of the design data into a generative adversarial network included in one or more components executed by one or more computer systems;

determining one or more characteristics of the simulated images; and selecting a mode of a tool used for a process performed on the specimen based on the determined one or more characteristics, wherein said modifying, generating, determining, and selecting are performed by the one or more computer systems.

* * * * *